(12) United States Patent
Mukai et al.

(10) Patent No.: US 8,248,010 B2
(45) Date of Patent: Aug. 21, 2012

(54) MOTOR DRIVING DEVICE, ELECTRIC POWER STEERING DEVICE USING THE SAME AND METHOD FOR DETECTING FAILURE IN THE SAME

(75) Inventors: Yasuhiko Mukai, Kariya (JP); Nobuhiko Uryu, Kariya (JP)

(73) Assignee: Denso Corporation, Kariya (JP)

( * ) Notice: Subject to any disclaimer, the term of this patent is extended or adjusted under 35 U.S.C. 154(b) by 110 days.

(21) Appl. No.: 12/975,910

(22) Filed: Dec. 22, 2010

(65) Prior Publication Data

US 2011/0156626 A1  Jun. 30, 2011

(30) Foreign Application Priority Data

Dec. 24, 2009  (JP) ................................ 2009-292691

(51) Int. Cl.
*H02P 7/08* (2006.01)
(52) U.S. Cl. ......... 318/400.21; 318/400.09; 318/400.02; 318/400.29; 701/42; 180/65.25; 180/65.285; 180/802
(58) Field of Classification Search ............ 318/400.09, 318/400.02, 400.29, 400.21; 701/42; 180/65.25, 180/65.285, 802
See application file for complete search history.

(56) References Cited

U.S. PATENT DOCUMENTS

| 2009/0058339 | A1* | 3/2009 | Kitano | 318/400.22 |
| 2009/0230901 | A1* | 9/2009 | Amano | 318/400.3 |
| 2009/0242293 | A1* | 10/2009 | Tanaka et al. | 180/65.285 |
| 2010/0017063 | A1* | 1/2010 | Maeda | 701/42 |
| 2010/0263953 | A1* | 10/2010 | Shimana | 180/65.285 |

* cited by examiner

*Primary Examiner* — Walter Benson
*Assistant Examiner* — Jorge Carrasquillo
(74) *Attorney, Agent, or Firm* — Nixon & Vanderhye PC

(57) ABSTRACT

A voltage application unit applies voltage to windings of a motor without passing though an inverter unit. A first detection unit detects a short circuit failure in switching elements of the inverter unit based on a terminal voltage between each of the switching elements and a corresponding winding and a power voltage of a power supply. Before rotation of the motor, when no short circuit failure is detected and when a switching unit switches at least one of the high and low potential-side switching elements of the inverter unit on and subsequently switches all the switching elements off, a second failure detection unit determines whether the switching unit is incapable of rendering the switching element non-conductive based on the terminal voltage and the power voltage.

16 Claims, 15 Drawing Sheets

MOTOR DRIVING DEVICE, ELECTRIC POWER STEERING DEVICE USING THE SAME AND METHOD FOR DETECTING FAILURE IN THE SAME

CROSS REFERENCE TO RELATED APPLICATIONS

This application is based on and incorporates herein by reference Japanese Patent Application No. 2009-292691 filed on Dec. 24, 2009.

FIELD OF THE INVENTION

The present invention relates to a motor driving device. The present invention further relates to an electric power steering device using the motor driving device. The present invention further relates to a method for detecting failure in the motor driving device.

BACKGROUND OF THE INVENTION

Motor driving devices that drive a motor by windings of multiple phases are conventionally known. In the electric power steering device disclosed in JPA-2009-6963, which corresponds to US 2010/0017063 A1, for example, a three-phase brushless motor is used and when any anomaly occurs in one phase, control is carried out to continue driving of the motor by the remaining two phases.

In general, any failure is detected in switching elements, a pre-driver, and the like before starting driving of a motor so that the motor will not be broken. As an example, it will be assumed that the inverter in each system is driven with setting so made that the rate of on and off of the high potential-side switching elements and the low potential-side switching elements is 1:1 in the inverter. When each inverter is normal, the terminal voltage is ½ of the voltage applied immediately before the inverter. When any failure has occurred, the terminal voltage is other than ½ of the voltage applied immediately before the inverter. Any failure in the inverters can be determined by utilizing this, for example.

However, when the above-mentioned so-called PWM driving is carried out in inverter failure detection, a problem may arise. When a failure (hereafter, referred to as "short circuit failure") in which any switching element cannot be brought out of conduction (non-conduction) has occurred, an overcurrent flows from a high potential-side switching element to a low potential-side switching element and this burns an inverter.

SUMMARY OF THE INVENTION

In view of the foregoing and other problems, it is an object of the present invention to produce a motor driving device in which a failure can be detected without passage of an overcurrent. It is an object of the present invention to produce an electric power steering device using the motor driving device. It is an object of the present invention to produce a method for detecting failure in the motor driving device.

According to one aspect of the present invention, a motor driving device comprises a motor including a plurality of winding sets having windings corresponding to a plurality of phases. The motor driving device further comprises an inverter unit provided for each of the winding sets and configured to supply a current to the windings, the inverter unit including a plurality of switching elements including switching element pairs respectively corresponding to the phases of the windings, each of the switching element pairs including a high potential-side switching element on a high potential side and a low potential-side switching element on a low potential side. The motor driving device further comprises a switching unit configured to switch each of the switching elements between on and off. The motor driving device further comprises a voltage application unit configured to apply a voltage to the windings without passing through the inverter unit. The motor driving device further comprises a power voltage detection unit configured to detect a power voltage between the inverter unit and a power supply. The motor driving device further comprises a terminal voltage detection unit configured to detect a terminal voltage at a contact between each of the switching elements and corresponding one of the windings. The motor driving device further comprises a control unit including a rotation control unit, a first failure detection unit, and a second failure detection unit. The rotation control unit is configured to control the switching unit to switch each of the switching elements between on and off to control rotation of the motor. The first failure detection unit is configured to detect a short circuit failure in the switching elements based on the terminal voltage and the power voltage before the rotation control unit starts control of the rotation of the motor. The second failure detection unit is configured such that, before the rotation control unit starts control of the rotation of the motor and when the first failure detection unit does not detect a failure in the switching elements and in a condition where the switching unit is caused to switch at least one of the high potential-side switching element and the low potential-side switching element on and subsequently switch all the switching elements off, the second failure detection unit determines whether the switching unit is incapable of rendering the switching element non-conductive to detect a short circuit failure in the switching unit based on the terminal voltage and the power voltage.

According to another aspect of the present invention, a method for detecting failure in a motor driving device, the motor driving device including: a motor including a plurality of winding sets having windings corresponding to a plurality of phases; an inverter unit provided for each of the winding sets and configured to supply a current to the windings, the inverter unit including a plurality of switching elements including switching element pairs respectively corresponding to the phases of the windings, each of the switching element pairs including a high potential-side switching element on a high potential side and a low potential-side switching element on a low potential side; and a switching unit configured to switch each of the switching elements between on and off, the method comprises detecting a power voltage between the inverter unit and a power supply. The method further comprises detecting a terminal voltage at a contact between each of the switching elements and corresponding one of the windings; applying a voltage to the windings without passing through the inverter unit to detect a short circuit failure in the switching elements based on the terminal voltage and the power voltage before rotation of the motor. The method further comprises causing, before rotation of the motor and when the short circuit failure in the switching elements is not detected, the switching unit to switch on at least one of the high potential-side switching element and the low potential-side switching element and subsequently switch all the switching elements off and determining whether the switching unit is incapable of rendering the switching element non-conductive to detect a short circuit failure in the switching unit based on the terminal voltage and the power voltage.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

Figure 1:
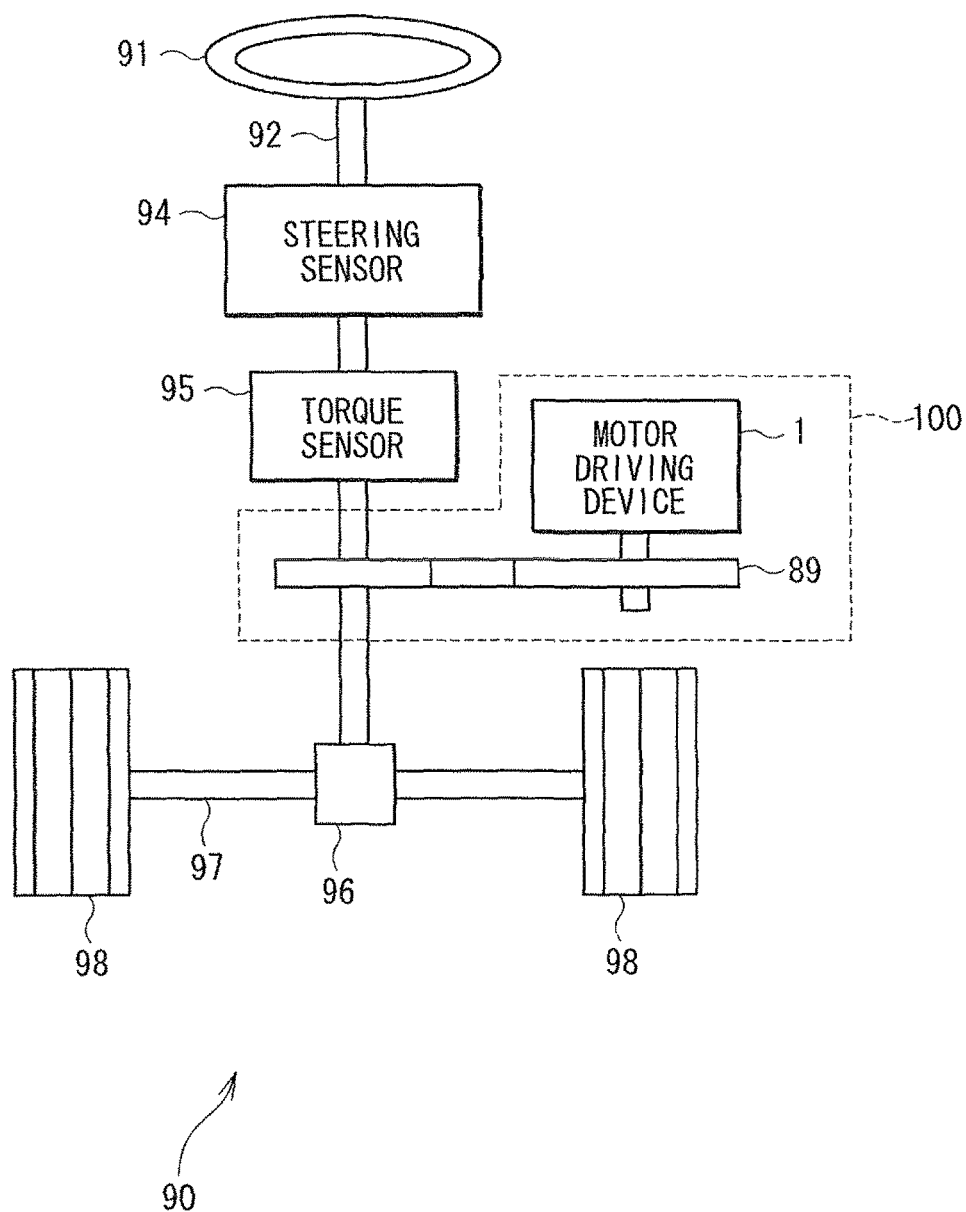
FIG. 1 is a schematic diagram illustrating an electric power steering device in a first embodiment of the invention.

Hereafter, description will be given to embodiments of the invention with reference to the drawings. FIG. 1 to FIG. 15 illustrate embodiments in which a motor driving device is applied to an electric power steering device for assisting steering operation in a vehicle. In the following description of multiple embodiments, substantially the same constituent elements will be marked with the same reference numerals and the description thereof will be omitted.

First Embodiment

FIG. 1 illustrates the overall configuration of a steering system equipped with an electric power steering device in the first embodiment of the invention. The steering shaft 92 connected to the steering wheel 91 of the electric power steering device 100 provided in the steering system 90 is provided with a steering sensor 94 and a torque sensor 95. The steering sensor 94 detects the rotation angle of the steering shaft 92. The torque sensor 95 detects steering wheel torque applied to the steering wheel. The tip of the steering shaft 92 is coupled to a rack shaft 97 through a gear 96. A pair of tires (wheels) 98 is coupled to both ends of the rack shaft 97 through a tie rod and the like. The rotational motion of the steering shaft 92 is converted into the linear motion of the rack shaft 97 by the gear 96 and the left and right tires 98 are steered by an angle equivalent to the linear motion displacement of the rack shaft 97.

The electric power steering device 100 includes: a motor 10 as a motor producing auxiliary steering wheel torque; a motor driving device 1 related to driving of the motor 10; a rotation angle sensor, not shown, that detects the rotation angle of the motor 10; and a gear 89 that decelerates the rotation of the motor 10 and transfers the decelerated rotation to the steering shaft 92. The motor 10 is a three-phase brushless motor that rotates the gear 89 in forward and reverse directions. The electric power steering device 100 transfers steering auxiliary torque corresponding to the steering direction of the steering wheel 91 and the steering wheel torque to the steering shaft 92.

Figure 2:
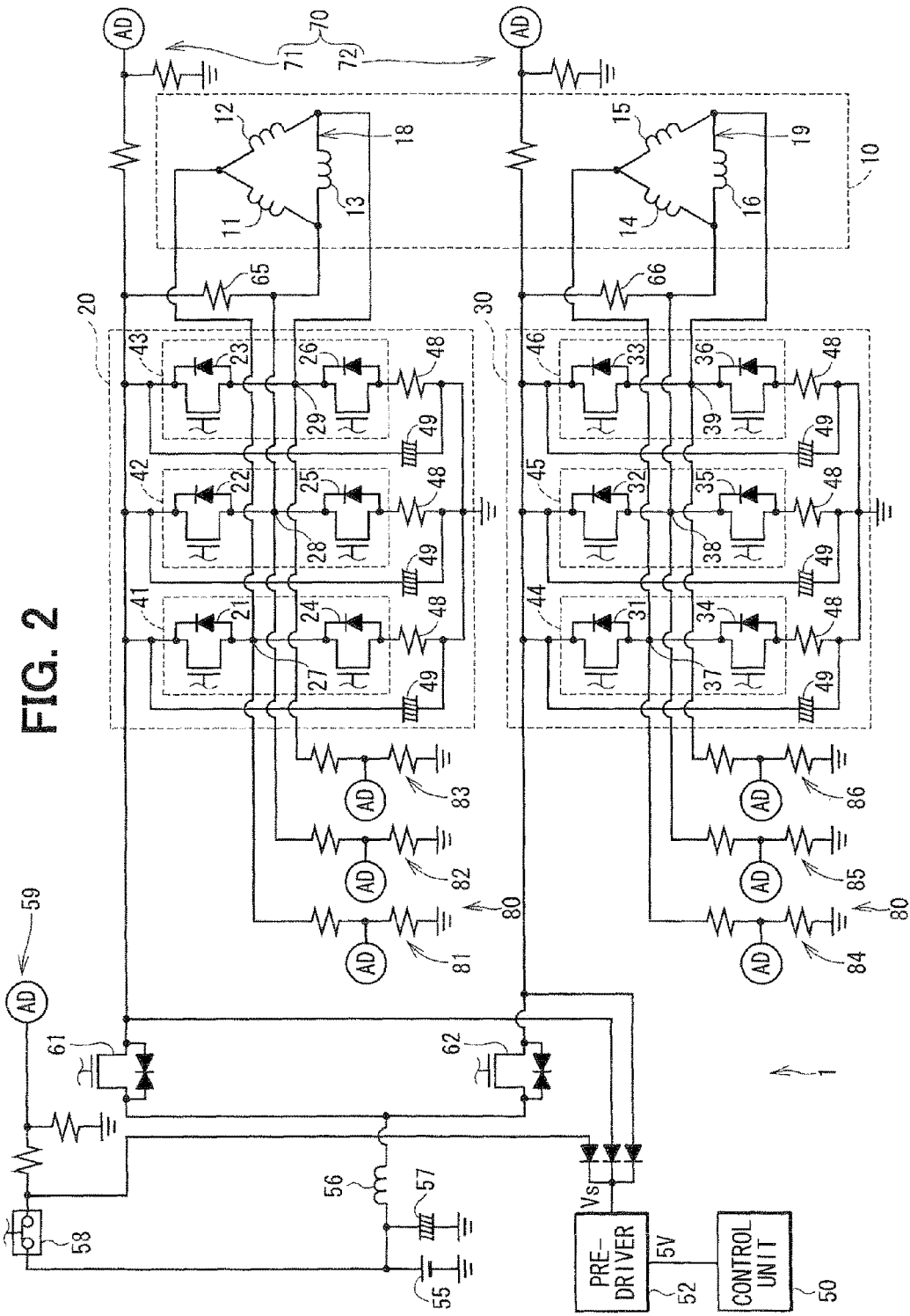
FIG. 2 is a circuit diagram illustrating the circuitry of a motor driving device in the first embodiment of the invention.

The motor 10 includes a stator, a rotor, and a shaft none of which is shown in the drawing. The rotor is a circular disk-like member rotated together with the shaft and has a permanent magnet stuck to its surface and has magnetic poles. The stator houses the rotor therein and rotatably supports the rotor. The stator includes protruded parts located at predetermined angular intervals and protruded to the inner radius side. The U1 coil 11, V1 coil 12, W1 coil 13, U2 coil 14, V2 coil 15, and W2 coil 16 illustrated in FIG. 2 are wound on these protruded parts. The U1 coil 11, V1 coil 12, and W1 coil 13 are Δ-connected to form a first winding set 18. The U2 coil 14, V2 coil 15, and W2 coil 16 are Δ-connected to form a second winding set 19. In this embodiment, each of the winding sets 18, 19 is Δ-connected but they may be Y-connected. The coils 11 to 16 may be equivalent to "winding" and the first winding set 18 and the second winding set 19 may be equivalent to "winding set." The motor 10 is provided with a rotation angle sensor for detecting the rotational position 8 of the rotor. In this embodiment, the rotation angle sensor is a resolver. The rotor angle can be estimated from each phase voltage, current, and the like without use of the rotation angle sensor.

Description will be given to the circuitry of the motor driving device 1 with reference to FIG. 2. The motor driving device 1 that drives the motor 10 includes: a first inverter unit 20 and a second inverter unit 30 as inverter units; a control unit 50; a pre-driver 52 as an energization state switching unit; a first voltage application unit 65; a second voltage application unit 66; a power voltage detection unit 70; a terminal voltage detection unit 80; and the like.

The first inverter unit 20 is a three-phase inverter and has six bridge-connected switching elements 21 to 26 to switch the energization of the U1 coil 11, V1 coil 12, and W1 coil 13 of the first winding set 18. In this embodiment, the switching elements 21 to 26 are metal-oxide-semiconductor field-effect transistors (MOSFETs), a type of field-effect transistor. Hereafter, the switching elements 21 to 26 will be referred to as MOSs 21 to 26.

The drains of three MOSs 21 to 23 are connected to the power supply side. The sources of the MOSs 21 to 23 are respectively connected to the drains of MOSs 24 to 26. The sources of the MOSs 24 to 26 are connected to the ground side. The U1 junction point 27 between the paired MOS 21 and MOS 24 is connected to one end of the U1 coil 11. The V1 junction point 28 between the paired MOS 22 and MOS 25 is connected to one end of the V1 coil 12. The W1 junction point 29 between the MOS 23 and the MOS 26 is connected to one end of the W1 coil 13.

Similarly to the first inverter unit 20, the second inverter unit 30 is a three-phase inverter and has six bridge-connected switching elements 31 to 36 to switch the energization of the U2 coil 14, V2 coil 15, W2 coil 16 of the second winding set 19. In this embodiment, the switching elements 31 to 36 are metal-oxide-semiconductor field-effect transistors (MOSFETs), a type of field-effect transistor. Hereafter, the switching elements 31 to 36 will be referred to as MOSs 31 to 36.

The drains of three MOSs 31 to 33 are connected to the power supply side. The sources of the MOSs 31 to 33 are respectively connected to the drains of MOSs 34 to 36. The sources of the MOSs 34 to 36 are connected to the ground side. The U2 junction point 37 between the paired MOS 31 and MOS 34 is connected to one end of the U2 coil 14. The V2 junction point 38 between the paired MOS 32 and MOS 35 is connected to one end of the V2 coil 15. The W2 junction point 39 between the paired MOS 33 and MOS 36 is connected to one end of the W2 coil 16.

The MOSs 21 to 23, 31 to 33 connected to the power supply side correspond to "high potential-side switching elements" (hereafter, referred to as "upper MOSs") and the MOSs 24 to 26, 34 to 36 connected to the ground side correspond to "low potential-side switching elements" (hereafter, referred to as "lower MOSs"). A corresponding winding will be described together like, for example, "U1 upper MOS 21" as required. The MOSs 21, 24 include a U1 switching element pair 41, the MOSs 22, 25 include a V1 switching element pair 42, and the MOSs 23, 26 include a W1 switching element pair 43. The MOSs 31, 34 include a U2 switching element pair 44, the MOSs 32, 35 include a V2 switching element pair 45, and the MOSs 33, 36 include a W2 switching element pair 46. The switching element pairs 41 to 46 may be equivalent to "switching element pair."

Each current detection unit 48 is formed of a shunt resistor and provided between each switching element pair 41 to 46 and ground. In this embodiment, a detection value detected by each current detection unit 48 is stored in a register, not shown, including the control unit 50. Acquisition of detection values by the six current detection units 48 is simultaneously carried out. At this time, the rotational position θ of the motor 10 from the rotation angle sensor is also acquired.

Each capacitor 49 is an aluminum electrolytic capacitor and assists power supply to the MOSs 21 to 26, 31 to 36 by storing electric charges. Each capacitor 49 removes a noise component, such as surge current.

The inverter units 20, 30 are supplied with power from a battery 55 as a power supply. A radio noise coil 56 and a power supply smoothing coil 57 are placed between the battery 55 and the inverter units 20, 30. The radio noise coil 56 and the power supply smoothing coil 57 include a filter circuit, which suppresses noise arising from driving of the inverter units 20, 30 from being transferred to other electronic components supplied with power from the battery 55.

The battery 55 is connected with an ignition switch 58. When the ignition switch 58 is turned on, failure detection processing, rotation control processing, and the like are carried out by the control unit 50. The ignition switch 58 is connected with an ignition voltage detection unit 59, which detects the voltage of an ignition line.

A first power supply relay 61 is placed between the battery 55 and filter circuit and the first inverter unit 20. A second power supply relay 62 is placed between the battery 55 and filter circuit and the second inverter unit 30. The power supply relays 61, 62 are used to quickly interrupt power supply from the battery 55 to the inverter units 20, 30 when any anomaly occurs in the inverter units 20, 30, pre-driver 52, or the like.

The first voltage application unit 65 is so configured as to apply voltage to the first winding set 18 with the first inverter unit 20 bypassed. The second voltage application unit 66 is so configured as to apply voltage to the second winding set 19 with the second inverter unit 30 bypassed. In this embodiment, each of the first voltage application unit 65 and the second voltage application unit 66 is configured of a pull-up resistor. The pull-up resistance is equal to the sum of two voltage dividing resistances including the terminal voltage detection units 81 to 86 described later.

The power voltage detection unit 70 is configured of a first PIG voltage detection unit 71 and a second PIG voltage detection unit 72. The first PIG voltage detection unit 71 is provided on the opposite side to the battery 55 with respect to the first power supply relay 61 and detects the relayed power supply voltage (hereafter, referred to as "PIG1 voltage") after the first power supply relay 61. Similarly, the second PIG voltage detection unit 72 is provided on the opposite side to the battery 55 with respect to the second power supply relay 62 and detects the relayed power supply voltage (hereafter, referred to as "PIG2 voltage") after the second power supply relay 62. In this embodiment, the "PIG1 voltage" and the "PIG2 voltage" are equivalent to "power voltage." Each of the PIG voltage detection units 71, 72 is configured of two voltage dividing resistances identical in magnitude. The control unit 50 acquires the voltage value at the middle point between two voltage dividing resistances and computes relayed voltage by AD conversion.

The terminal voltage detection unit 80 is configured of the U1 terminal voltage detection unit 81, V1 terminal voltage detection unit 82, W1 terminal voltage detection unit 83, U2 terminal voltage detection unit 84, V2 terminal voltage detection unit 85, and W2 terminal voltage detection unit 86. The U1 terminal voltage detection unit 81 is connected to the junction point 27 between the U1 switching element pair 41 and the U1 coil 11. The V1 terminal voltage detection unit 82 is connected to the junction point 28 between the V1 switching element pair 42 and the V1 coil 12. The W1 terminal voltage detection unit 83 is connected to the junction point 29 between the W1 switching element pair 43 and the W1 coil 13. The U2 terminal voltage detection unit 84 is connected to the junction point 37 between the U2 switching element pair 44 and the U2 coil 14. The V2 terminal voltage detection unit 85 is connected to the junction point 38 between the V2 switching element pair 45 and the V2 coil 15. The W2 terminal voltage detection unit 86 is connected to the junction point 39 between the W2 switching element pair 46 and the W2 coil 16.

Each of the terminal voltage detection units 81 to 86 is configured of two voltage dividing resistances identical in magnitude. The control unit 50 acquires the voltage value at the middle point between two voltage dividing resistances by way of a low-pass filter, not shown, and computes the terminal voltage at each winding terminal by AD conversion. Hereafter, the terminal voltage detected by the U1 terminal voltage detection unit 81 will be referred to as U1 terminal voltage; the terminal voltage detected by the V1 terminal voltage detection unit 82 will be referred to as V1 terminal voltage; and the terminal voltage detected by the W1 terminal voltage detection unit 83 will be referred to as W1 terminal voltage. The terminal voltage detected by the U2 terminal voltage detection unit 84 will be referred to as U2 terminal voltage; the terminal voltage detected by the V2 terminal voltage detection unit 85 will be referred to as V2 terminal voltage; and the terminal voltage detected by the W2 terminal voltage detection unit 86 will be referred to as W2 terminal voltage. The U1 terminal voltage, V1 terminal voltage, W1 terminal voltage, U2 terminal voltage, V2 terminal voltage, and W2 terminal voltage are equivalent to "terminal voltage" and each terminal voltage can take a value between 0 and the PIG1 voltage or the PIG2 voltage.

When all the MOSs 21 to 26 are out of conduction (non-conduction) in the first inverter unit 20, the U1 terminal voltage, V1 terminal voltage, and W1 terminal voltage are all 50% of the PIG1 voltage. When all the MOSs 31 to 36 in the second inverter unit 30 are out of conduction, the U2 terminal voltage, V2 terminal voltage, and W2 terminal voltage are all 50% of the PIG2 voltage.

The control unit 50 controls the entire motor driving device 1 and is configured of a common microcomputer. The control lines from the control unit 50 are omitted to restrict the drawing from being complicated. The control unit 50 controls on and off of the MOSs 21 to 26, 31 to 36 through the pre-driver 52 based on the following: the detection value detected by each current detection unit 48 and the rotational position θ of the rotor detected by the rotation angle sensor. The control unit thereby controls the currents passed through the coils 11 to 16. As a result, the rotation of the motor 10 is controlled. The pre-driver 52 in this embodiment is configured of a charge pump-type circuit. The control unit 50 carries out failure detection processing to detect any failure in the first inverter unit 20, second inverter unit 30, and pre-driver 52.

Description will be given to the failure detection processing by the control unit 50 with reference to the flowcharts in FIG. 3 to FIG. 8. The failure detection processing in the first inverter unit 20 and the failure detection processing in the second inverter unit 30 are identical with each other; therefore, the failure detection processing in the first inverter unit 20 will be described here. The failure detection processing in the first inverter unit 20 and the failure detection processing in the second inverter unit 30 can be simultaneously carried out.

Figure 3:
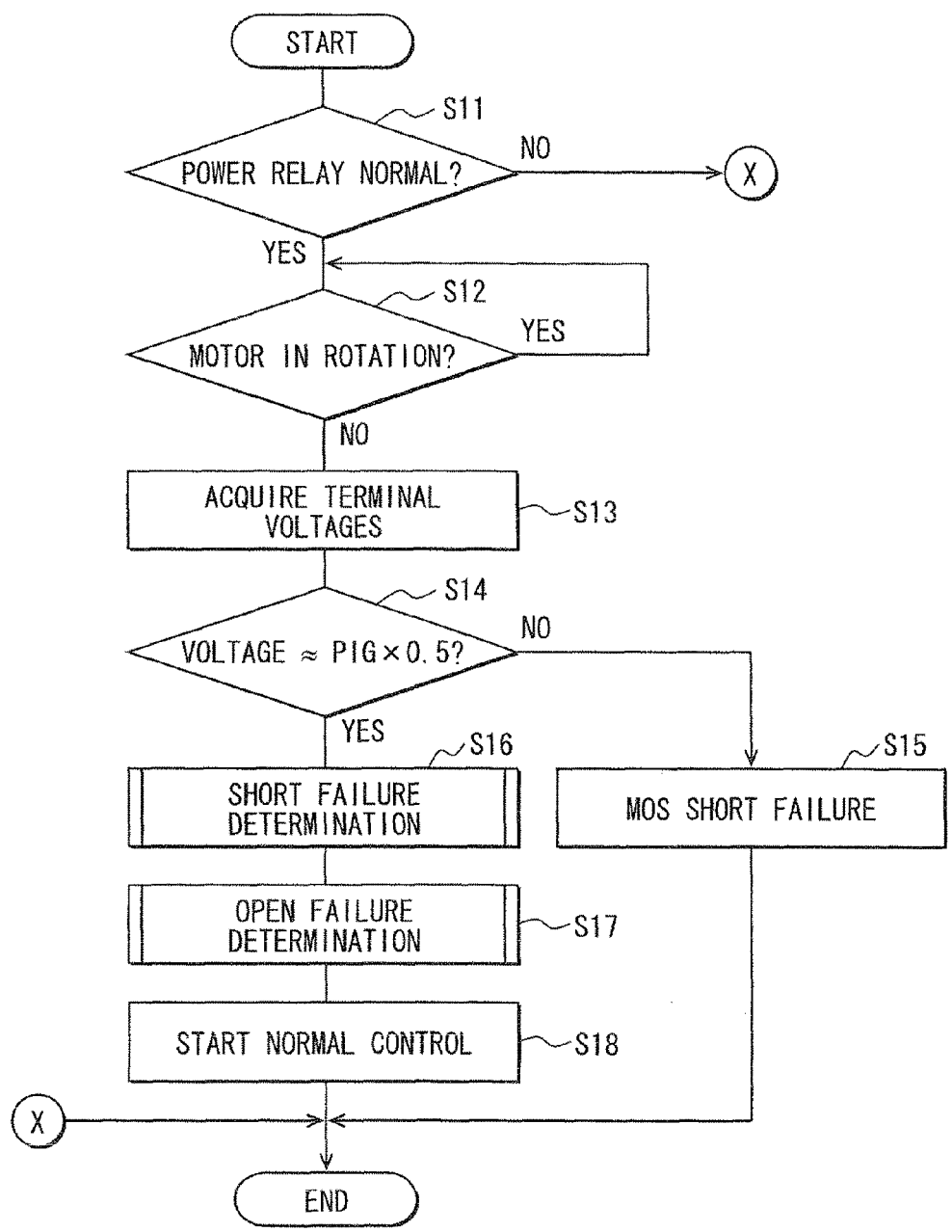
FIG. 3 is a flowchart illustrating failure detection processing in the first embodiment of the invention.

Description will be given to the main flow of the failure detection processing illustrated in FIG. 3. The failure detection processing illustrated in FIG. 3 is carried out when the ignition switch 58 is turned on. At the first step, or Step S11 (hereafter, "Step" will be omitted and each step will be indicated simply by symbol "S"), it is determined whether or not the first power supply relay 61 is normal. When it is determined that the first power supply relay 61 is not normal (S11: NO), the processing of S12 and the following steps is not carried out. When it is determined that the first power supply relay 61 is normal (S11: YES), the flow proceeds to S12.

At S12, it is determined based on the rotational position θ acquired from the rotation angle sensor whether or not the motor 10 is rotating. When it is determined that the motor 10 is rotating (S12: YES), this determination processing is repeated. When it is determined that the motor 10 is not rotating (S12: NO), the flow proceeds to S13.

At S13, the U1 terminal voltage, 101 terminal voltage, and W1 terminal voltage are acquired. At S14, it is determined whether or not each of the U1 terminal voltage, V1 terminal voltage, and W1 terminal voltage agrees with 50% of the PIG1 voltage. That is, this determination processing determines whether or not each terminal voltage agrees with the voltage applied by the first voltage application unit 65 when all the MOSs 21 to 26 are out of conduction. This embodiment is configured to implement the following so that the voltage applied by the first voltage application unit 65 is equal to 50% of the PIG1 voltage when all the MOSs 21 to 26 are out of conduction: the resistance value of the pull-up resistor of the first voltage application unit 65 agrees with the sum of the resistance values of the resistors including the individual terminal voltage detection units. This makes it possible to set a threshold value at the center of the PIG1 voltage. Therefore, failure determination can be appropriately carried out even when any of the upper MOSs 21 to 24 and the lower MOSs 24 to 26 is faulty. This is the same with the determination processing for a short circuit failure in the pre-driver 52, described later. When it is determined that each of the U1 terminal voltage, V1 terminal voltage, and W1 terminal voltage agrees with 50% of the PG1 voltage (S14: YES), the flow proceeds to S16. When it is determined that any of the U1 terminal voltage, V1 terminal voltage, and W1 terminal voltage does not agree with 50% of the PIG1 voltage (S14: NO), the flow proceeds to S15.

At S15, it is concluded that a short circuit failure has occurred in at least one of the MOSs 21 to 26. When a terminal voltage is higher than output of 50% of the PIG1 voltage and substantially agrees with the PIG1 voltage, it can be concluded that a short circuit failure has occurred in at least one of the upper MOSs 21 to 23. When a terminal voltage is lower than output of 50% of the PIG1 voltage or and substantially equal to zero, it can be concluded that a short circuit failure has occurred in at least one of the lower MOSs 24 to 26.

In this embodiment, it is determined at S14 that a "terminal voltage agrees with 50% of the PIG1 voltage" in the following cases: cases where the terminal voltage is within a predetermined range with a value obtained by multiplying the PIG1 voltage by ½ at the center. When a short circuit failure has occurred in an upper MOS, as mentioned above, the terminal voltage substantially agrees with the PIG1 voltage; and when a short circuit failure has occurred in a lower MOS, the terminal voltage substantially agrees with zero. Therefore, the predetermined range with the 50% output of the PIG1 voltage used at S14 can be arbitrarily set between 0 and power supply voltage with measurement error and the like taken into account.

At S16 to which the flow proceeds when it is determined that the U1 terminal voltage, V1 terminal voltage, and W1 terminal voltage agree with 50% of the PIG1 voltage (S14: YES), the following processing is carried out: it is concluded that a short circuit failure due to fixation at on or the like has not occurred in any of all the MOSs 21 to 26 and short circuit failure determination processing is carried out. At the subsequent step, or S17, open failure determination processing is carried out. The short circuit failure determination processing carried out at S16 and the open failure determination processing carried out at S17 will be described later. At S18 to which the flow proceeds when a failure is not detected in the short circuit failure determination processing carried out S16 and the open failure determination processing carried out at S17, drive control on the motor 10 by normal PWM control is started.

Figure 4:
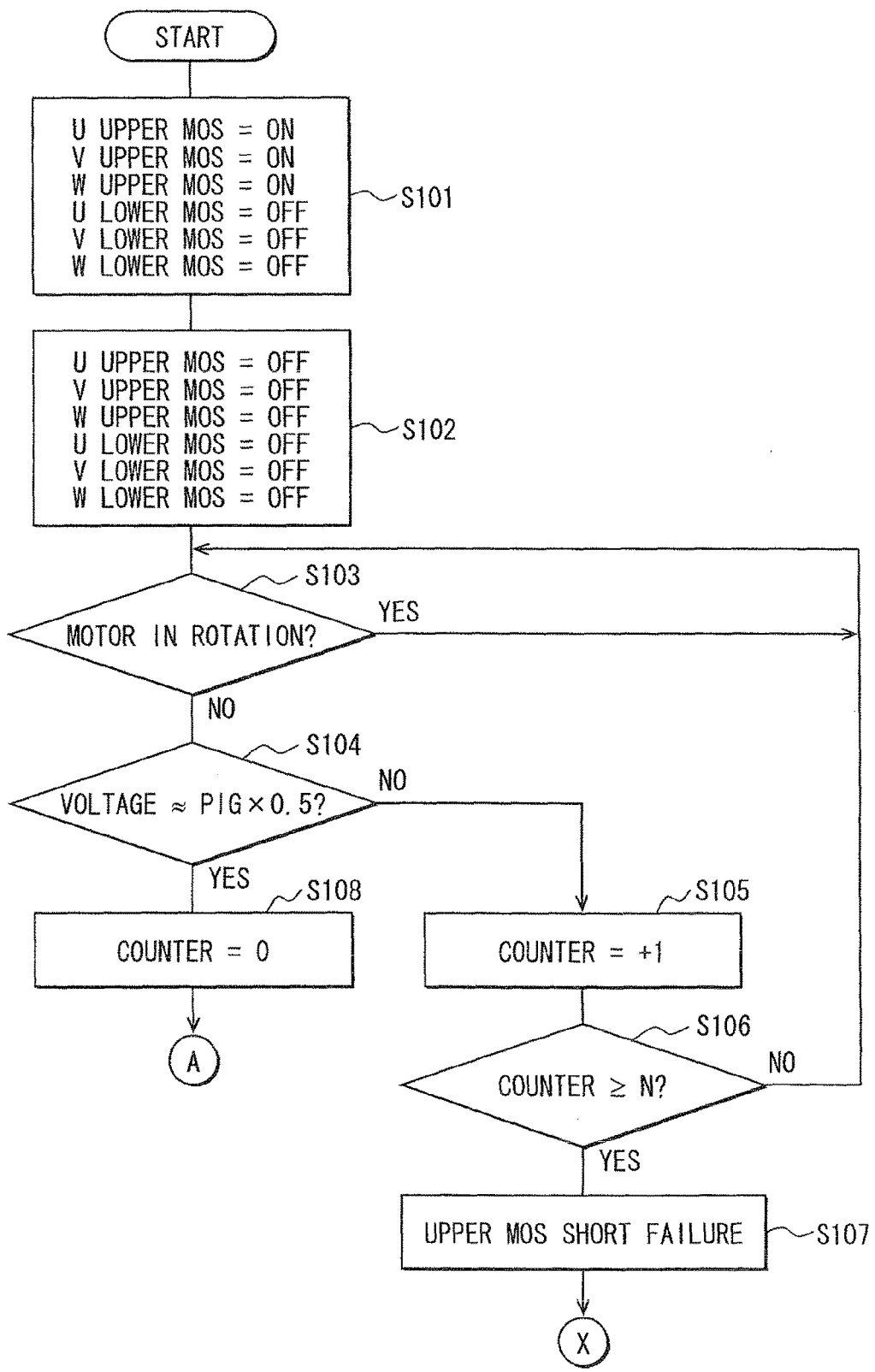
FIG. 4 is a flowchart illustrating second failure detection processing in the first embodiment of the invention.
Figure 5:
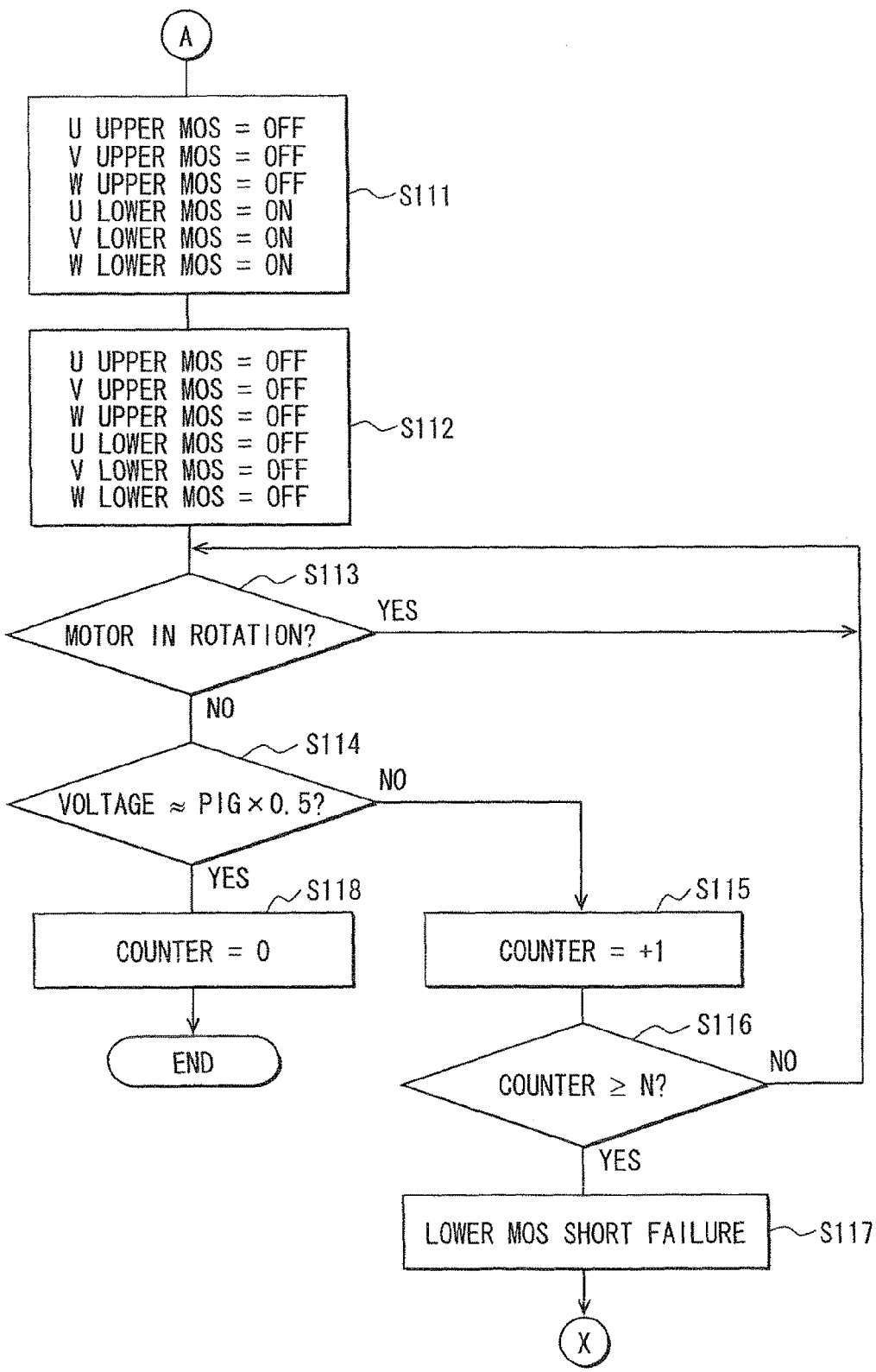
FIG. 5 is a flowchart illustrating the second failure detection processing in the first embodiment of the invention.

Description will be given to the short circuit failure determination processing at S16 with reference to FIG. 4 and FIG. 5. FIG. 4 illustrates processing for detecting a short circuit failure at a point related to switching of the upper MOSs 21 to 23 between on and off at the pre-driver 52; and FIG. 5 illustrates processing for detecting a short circuit failure at a point related to switching of the lower MOSs 21 to 24 between on and off. At the first step, S101, in FIG. 4, drive control is carried out so that all the upper MOSs 21 to 23 in the first inverter unit 20 are simultaneously turned on through the pre-driver 52. Hereafter, drive control carried out on the MOSs 21 to 26 to turn them on or off will be referred to as "on-control" or "off-control." When all the upper MOSs 21 to 23 are on-controlled, all the lower MOSs 24 to 26 in the first inverter unit 20 remain off. At this time, it has been concluded that there is no short circuit failure in any of the lower MOSs 24 to 26 themselves. Even though the upper MOSs 21 to 23 are on-controlled, therefore, an overcurrent does not flow. At S102, the upper MOSs 21 to 23 on-controlled at S101 are off-controlled.

At S103, it is determined based on the rotational position θ acquired from the rotation angle sensor whether or not the motor 10 is rotating. When it is determined that the motor 10 is rotating (S103: YES), this determination processing is repeated. When it is determined that the motor 10 is not rotating (S103: NO), the flow proceeds to S104.

At S104, it is determined whether or not each of the U1 terminal voltage, V1 terminal voltage, and W1 terminal voltage agrees with 50% of the PIG1 voltage. When a terminal voltage is within a predetermined range with an output value of 50% of the PIG1 voltage at the center, it is determined that the "terminal voltage agrees with 50% of the PIG1 voltage." The predetermined range can be arbitrarily set between 0 and power supply voltage with measurement error and the like taken into account. When it is determined that each of the U1 terminal voltage, V1 terminal voltage, and W1 terminal voltage agrees with 50% of the PIG1 voltage (S104: YES), the flow proceeds to S108. When it is determined that any of the U1 terminal voltage, V1 terminal voltage, and W1 terminal voltage does not agree with 50% of the PIG1 voltage (S104: NO), the flow proceeds to S105. It may be so configured that the following measure is taken: the determination processing at S104 determines whether or not each of the U1 terminal voltage, V1 terminal voltage, and W1 terminal voltage substantially agrees with the PIG1 voltage; when any of the U1 terminal voltage, V1 terminal voltage, and W1 terminal voltage does not substantially agree with the PIG1 voltage, the flow proceeds to S108; and when they substantially agree with the PIG1 voltage, the flow proceeds to S105.

At S105, an anomaly counter is incremented and the flow proceeds to S106. At S106, it is determined whether or not the count on the anomaly counter is equal to or higher than a predetermined number of times N. When it is determined that the count on the anomaly counter is not equal to or higher than the predetermined number of times N (S106: NO), the flow returns to S103. When it is determined that the count on the anomaly counter is equal to or higher than the predetermined number of times N (S106: YES), the flow proceeds to S107. At S107, it is concluded that a short circuit failure in which the upper MOSs 21 to 23 cannot be brought out of conduction has occurred in the pre-driver 52 and the failure detection processing is terminated.

At S108 to which the flow proceeds when it is determined that each of the U1 terminal voltage, V1 terminal voltage, and W1 terminal voltage agrees with 50% of the PIG1 voltage (S104: YES), all the upper MOSs 21 to 23 are out of conduction. Therefore, it is concluded that a short circuit failure has not occurred at a point at which the upper MOSs 21 to 23 are switched between on and off in the pre-driver 52. Then the anomaly counter is reset and the flow proceeds to Sill in FIG. 5.

At Sill in FIG. 5, all the lower MOSs 24 to 26 in the first inverter unit 20 are simultaneously on-controlled through the pre-driver 52. At this time, all the upper MOSs 21 to 23 in the first inverter unit 20 has remained off. In this embodiment, it is has been concluded that there is no short circuit failure at a point at which the upper MOSs 21 to 23 are switched between on and off in the pre-driver 52. Therefore, even though the lower MOSs 21 to 23 are turned on, an overcurrent does not flow from an upper MOS to a lower MOS. At S112, the lower MOSs 24 to 26 on-controlled at S111 are off-controlled.

At S113, it is determined based on the rotational position θ acquired from the rotation angle sensor whether or not the motor 10 is rotating. When it is determined that the motor 10 is rotating (S113: YES), this determination processing is repeated. When it is determined that the motor 10 is not rotating (S113: NO), the flow proceeds to S114.

At S114, it is determined whether or not each of the U1 terminal voltage, V1 terminal voltage, and W1 terminal voltage agrees with 50% of the PIG1 voltage. When a terminal voltage is within a predetermined range with an output value of 50% of the PIG voltage at the center, it is determined that the "terminal voltage agrees with 50% of PIG1 voltage." The predetermined range can be arbitrarily set between 0 and power supply voltage with measurement error and the like taken into account. When it is determined that each of the U1 terminal voltage, V1 terminal voltage, and W1 terminal voltage agrees with 50% of the PIG1 voltage (S114: YES), the flow proceeds to S118. When it is determined that any of the U1 terminal voltage, V1 terminal voltage, and W1 terminal voltage does not agree with 50% of the PIG1 voltage (S114: NO), the flow proceeds to S115. It may be so configured that the following measure is taken: the determination processing at S114 determines whether or not each of the U1 terminal voltage, V1 terminal voltage, and W1 terminal voltage is substantially zero; when any of the U1 terminal voltage, V1 terminal voltage, and W1 terminal voltage is not substantially zero, the flow proceeds to S108; and when they are substantially zero, the flow proceeds to S115.

At S115, the anomaly counter is incremented and the flow proceeds to S116. At S116, it is determined whether or not the count on the anomaly counter is equal to or higher than the predetermined number of times N. When it is determined that the count on the anomaly counter is not equal to or higher than the predetermined number of times N (S116: NO), the flow returns to S113. When it is determined that the count on the anomaly counter is equal to or higher than the predetermined number of times N (S116: YES), the follow proceeds to S117. At S117, it is concluded that a short circuit failure in which the lower MOSs 24 to 26 cannot be brought out of conduction has occurred in the pre-driver 52 and the failure detection processing is terminated.

At S118 to which the flow proceeds when it is determined that each of the U1 terminal voltage, V1 terminal voltage, and W1 terminal voltage agrees with 50% of the PIG1 voltage (S114: YES), all the lower MOSs 24 to 26 are out of conduction. Therefore, it is concluded that a short circuit failure in which the lower MOSs 24 to 26 cannot be brought out of conduction has not occurred in the pre-driver 52. The anomaly counter is reset. Then the short circuit failure determination processing is terminated.

In the short circuit failure determination processing in this embodiment, a short circuit failure in the upper MOSs 21 to 23 is identified (FIG. 4) first and then a short circuit failure in the lower MOSs 24 to 26 is identified (FIG. 5). Instead, a short circuit failure in the lower MOSs 24 to 26 may be identified (FIG. 5) first and then a short circuit failure in the upper MOSs 21 to 24 may be identified. That is, the processing of S101 to S108 in FIG. 4 may be carried out after the processing of S111 to S118 in FIG. 5 is carried out.

Figure 6:
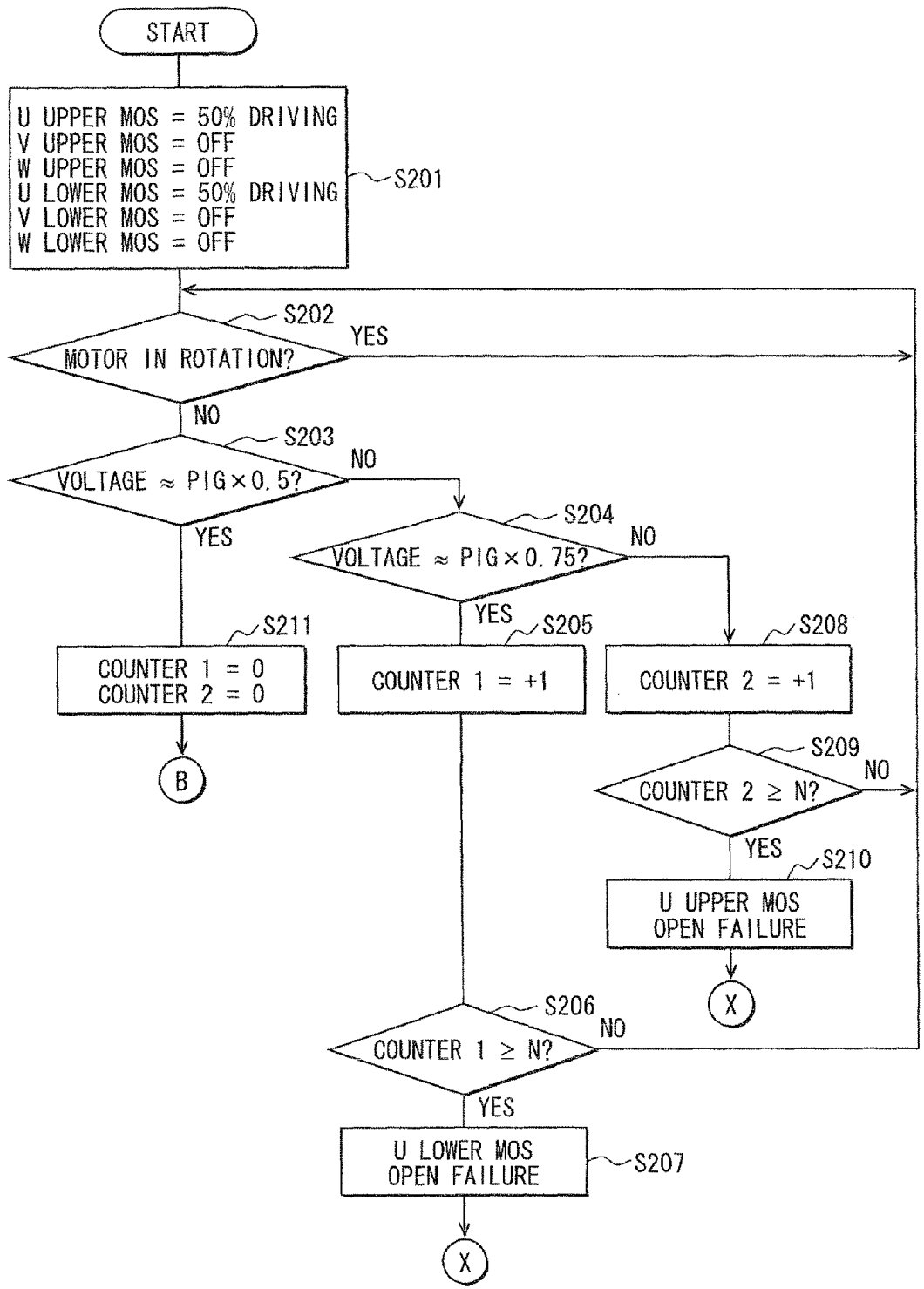
FIG. 6 is a flowchart illustrating third failure detection processing in the first embodiment of the invention.
Figure 7:
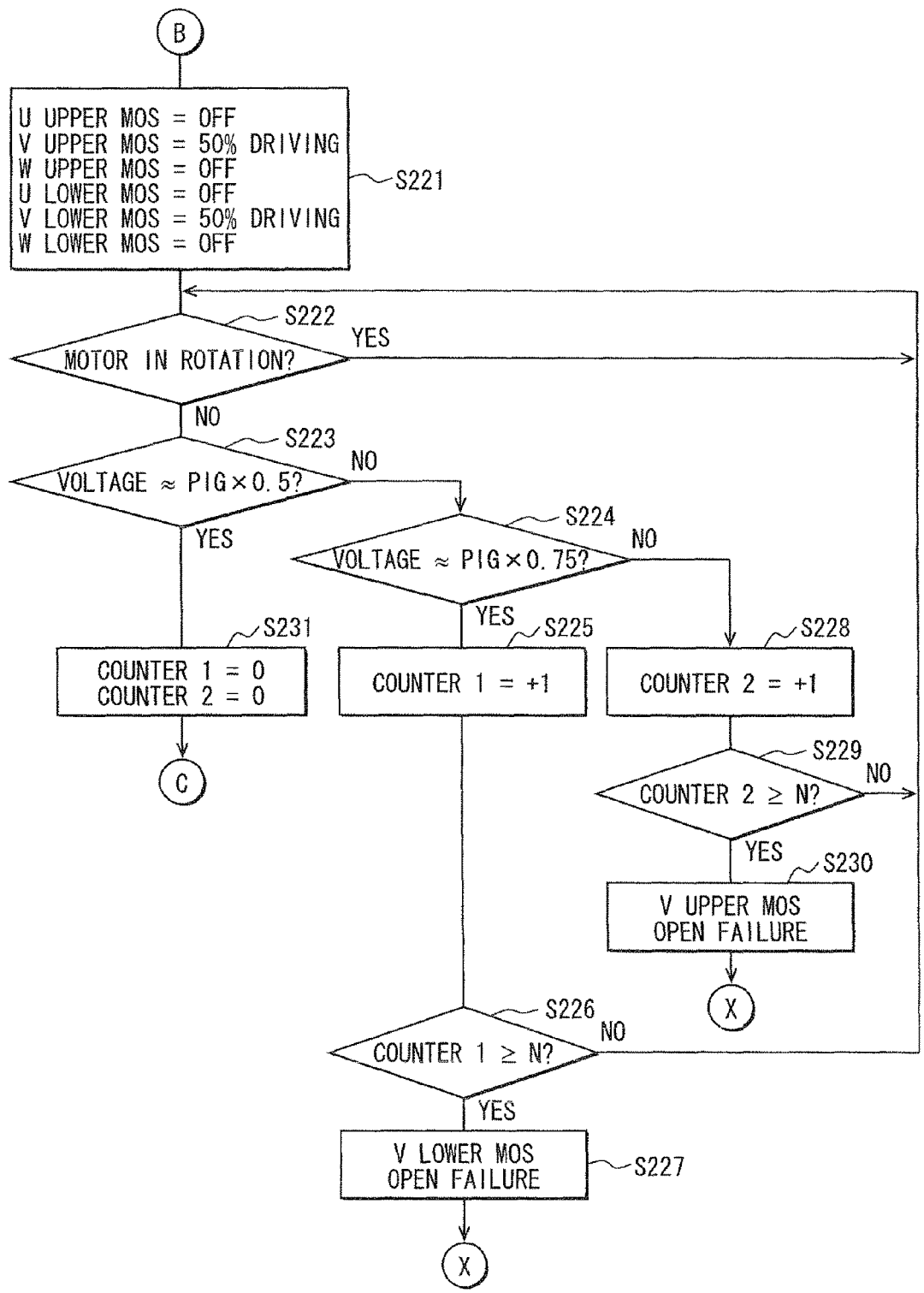
FIG. 7 is a flowchart illustrating the third failure detection processing in the first embodiment of the invention.
Figure 8:
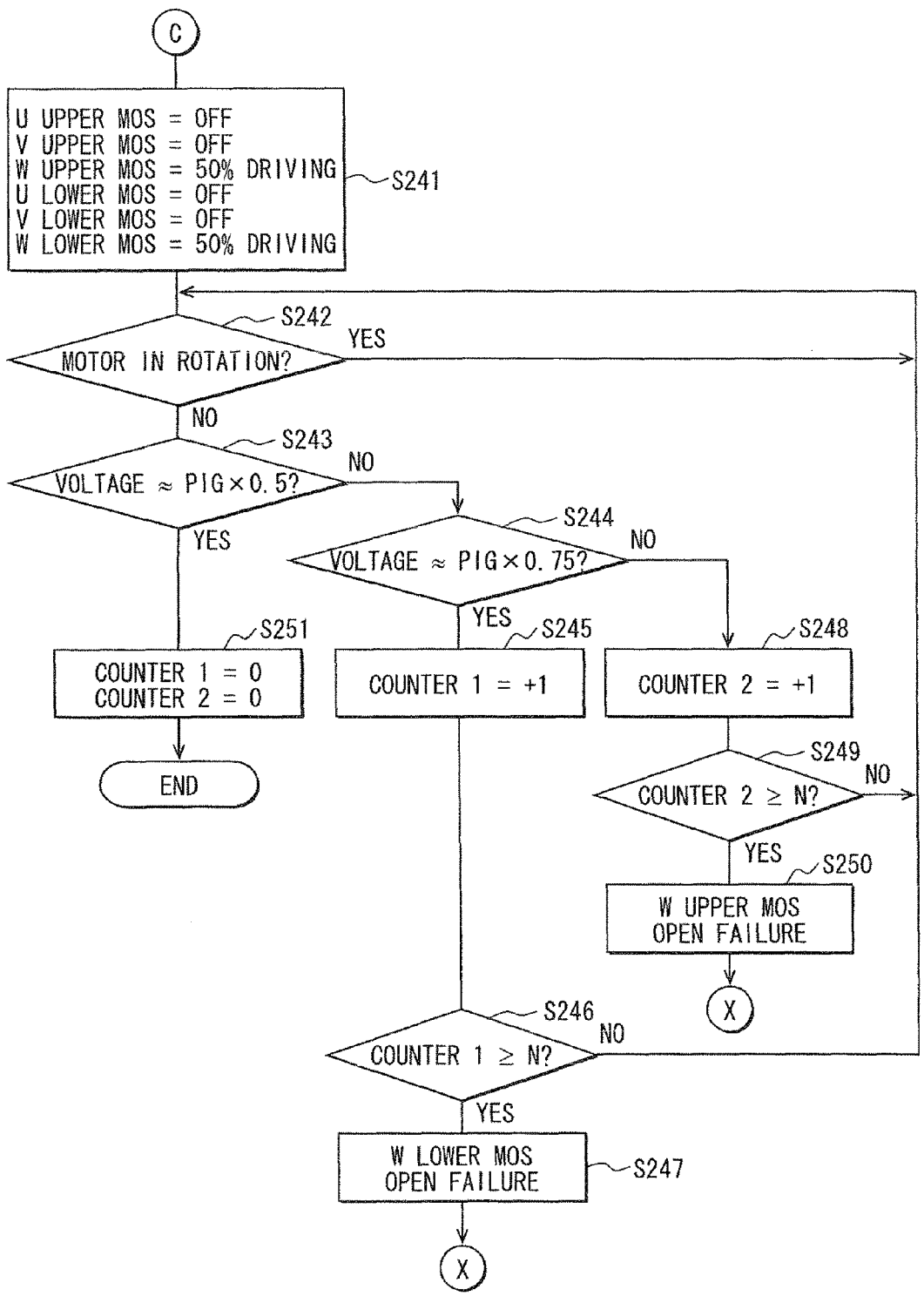
FIG. 8 is a flowchart illustrating the third failure detection processing in the first embodiment of the invention.

Description will be given to the open failure determination processing at S17 with reference to FIG. 6 to FIG. 8. FIG. 6 illustrates processing for detecting any open failure in which the U1 switching element pair 41 cannot be brought into conduction; FIG. 7 illustrates processing for detecting any open failure in which the V1 switching element pair 42 cannot be brought into conduction; and FIG. 8 illustrates processing for detecting any open failure in which the W1 switching element pair 43 cannot be brought into conduction.

At S201 in FIG. 6, 50% PWM driving is carried out in the U1 switching element pair 41. That is, the following states are periodically repeated so that the period during which the U1 upper MOS 21 is on-controlled in one cycle is 50%: a state in which the U1 upper MOS 21 is on-controlled and the U1 lower MOS 24 is off-controlled and a state in which the U1 upper MOS 21 is off-controlled and the U1 lower MOS 24 is off-controlled. At this time, it has been concluded that there is no short circuit failure in the MOSs 21, 24 or the pre-driver 52. Even though PWM driving is carried out, therefore, an overcurrent does not flow from the U1 upper MOS 21 to the U1 lower MOS 24.

At S202, it is determined based on the rotational position θ acquired from the rotation angle sensor whether or not the motor 10 is rotating. When it is determined that the motor 10 is rotating (S202: YES), this determination processing is repeated. When it is determined that the motor 10 is not rotating (S202: YES), the flow proceeds to S203.

At S203, it is determined whether or not the U1 terminal voltage agrees with 50% of the PIG1 voltage. When it is within a predetermined range with an output value of 50% of the PIG1 voltage at the center, it is determined that "the U1 terminal voltage agrees with 50% of the PIG1 voltage." The predetermined range can be arbitrarily set between 0 and power supply voltage with measurement error and the like taken into account. When it is determined that the U1 terminal voltage agrees with 50% of the PIG1 voltage (S203: YES), the flow proceeds to S211. When it is determined that the U1 terminal voltage does not agree with 50% of the PIG1 voltage (S203: NO), the flow proceeds to S204.

At S204, it is determined whether or not the U1 terminal voltage agrees with 75% of the PIG1 voltage. When it is determined that the U1 terminal voltage does not agree with 75% of the PIG1 voltage (S204: NO), the flow proceeds to S208. When it is determined that the U1 terminal voltage agrees with 75% of the PIG1 voltage (S204: YES), the flow proceeds to S205.

At S205, a first anomaly counter is incremented. At S206, it is determined whether or not the count on the first anomaly counter is equal to or higher than a predetermined number of times N. When it is determined that the count on the first anomaly counter is not equal to or higher than the predetermined number of times N (S206: NO), the flow returns to S202. When it is determined that the count on the first anomaly counter is equal to or higher than the predetermined number of times N (S206: YES), the flow proceeds to S207. At S207, an open failure in which the U1 lower MOS 24 cannot be brought into conduction is identified. Then the PWM driving of the U1 switching element pair 41 is stopped and the failure detection processing is terminated.

At S208 to which the flow proceeds when it is determined that the U1 terminal voltage does not agree with 75% of the PIG1 voltage (S204: NO), a second anomaly counter is incremented. At S209, it is determined whether or not the count on the second anomaly counter is equal to or higher than the predetermined number of times N. When it is determined that the count on the second anomaly counter is not equal to or higher than the predetermined number of times N (S209: NO), the flow returns to S202. When it is determined that the count on the second anomaly counter is equal to or higher than the predetermined number of times N (S209: YES), the flow proceeds to S210. At S210, an open failure in which the U1 upper MOS 21 cannot be brought into conduction is identified. Then the PWM driving of the U1 switching element pair 41 is stopped and the failure detection processing is terminated.

At S211 to which the flow proceeds when it is determined that the U1 terminal voltage agrees with 50% of the PIG1 voltage (S203: YES), it is concluded that there is no open failure in the U1 switching element pair 41. The first anomaly counter and the second anomaly counter are reset and the PWM driving of the U1 switching element pair 41 is stopped. Then the flow proceeds to S221 in FIG. 7.

At S221 in FIG. 7, 50% PWM driving is carried out in the V1 switching element pair 42. That is, the following states are periodically repeated so that the period during which the V1 upper MOS 22 is on-controlled in one cycle is 50%: a state in which the V1 upper MOS 22 is on-controlled and the V1 lower MOS 25 is off-controlled and a state in which the V1 upper MOS 22 is off-controlled and the V1 lower MOS 25 is on-controlled. At this time, it has been concluded that there is no short circuit failure in the MOSs 22, 25 or the pre-driver 52. Even though PWM driving is carried out, therefore, an overcurrent does not flow from the V1 upper MOS 22 to the V1 lower MOS 25.

At S222, it is determined based on the rotational position θ acquired from the rotation angle sensor whether or not the motor 10 is rotating. When it is determined that the motor 10 is rotating (S222: YES), this determination processing is repeated. When it is determined that the motor 10 is not rotating (S222: NO), the flow proceeds to S223.

At S223, it is determined whether or not the V1 terminal voltage agrees with 50% of the PIG1 voltage. When it is within a predetermined range with an output value of 50% of the PIG1 voltage at the center, it is determined that "the V1 terminal voltage agrees with 50% of the PIG1 voltage." The predetermined range can be arbitrarily set between 0 and power supply voltage with measurement error and the like taken into account. When it is determined that the V1 terminal voltage agrees with 50% of the PIG1 voltage (S223: YES), the flow proceeds to S231. When it is determined that the U1 terminal voltage does not agree with 50% of the PIG1 voltage (S223: NO), the flow proceeds to S224.

At S224, it is determined whether or not the V1 terminal voltage agrees with 75% of the PIG1 voltage. When it is determined that the V1 terminal voltage does not agree with 75% of the PIG1 voltage (S224: NO), the flow proceeds to S228. When it is determined that the V1 terminal voltage agrees with 75% of the PIG1 voltage (S224: YES), the flow proceeds to S225.

At S225, the first anomaly counter is incremented. At S226, it is determined whether or not the count on the first anomaly counter is equal to or higher than the predetermined number of times N. When it is determined that the count on the first anomaly counter is not equal to or higher than the predetermined number of times N (S226: NO), the flow returns to S222. When it is determined that the count on the first anomaly counter is equal to or higher than the predetermined number of times N (S226: YES), the flow proceeds to S227. At S227, an open failure in which the V1 lower MOS 25 cannot be brought into conduction is identified. Then the PWM driving of the V1 switching element pair 42 is stopped and the failure detection processing is terminated.

At S228 to which the flow proceeds when it is determined that the V1 terminal voltage does not agree with 75% of the PIG1 voltage (S224: NO), the second anomaly counter is incremented. At S229, it is determined whether or not the count on the second anomaly counter is equal to or higher than the predetermined number of times N. When it is determined that the count on the second anomaly counter is not equal to or higher than the predetermined number of times N (S229: NO), the flow returns to S222. When it is determined that the count on the second anomaly counter is equal to or higher than the predetermined number of times N (S229: YES), the flow proceeds to S230. At S230, an open failure in which the V1 upper MOS 22 cannot be brought into conduction is identified. Then the PWM driving of the V1 switching element pair 42 is stopped and the failure detection processing is terminated.

At S231 to which the flow proceeds when it is determined that the V1 terminal voltage agrees with 50% of the PIG1 voltage (S223: YES), it is concluded that there is no open failure in the V1 switching element pair 42. The first anomaly counter and the second anomaly counter are reset and the PWM driving of the V1 switching element pair 42 is stopped. Then the flow proceeds to S241 in FIG. 8.

At S241 in FIG. 8, 50% PWM driving is carried out in the W1 switching element pair 43. That is, the following states are periodically repeated so that the period during which the W1 upper MOS 23 is on-controlled in one cycle is 50%: a state in which the W1 upper MOS 23 is on-controlled and the W1 lower MOS 26 is off-controlled and a state in which the W1 upper MOS 23 is off-controlled and the W1 lower MOS 26 is on-controlled. At this time, it has been concluded that there is no short circuit failure in the MOSs 23, 26 or the pre-driver 52. Even though PWM driving is carried out, therefore, an overcurrent does not flow from the W1 upper MOS 23 to the W1 lower MOS 26.

At S242, it is determined based on the rotational position θ acquired from the rotation angle sensor whether or not the motor 10 is rotating. When it is determined that the motor 10 is rotating (S242: YES), this determination processing is repeated. When it is determined that the motor 10 is not rotating (S242: NO), the flow proceeds to S243.

At S243, it is determined whether or not the W1 terminal voltage agrees with 50% of the PIG1 voltage. When it is within a predetermined range with an output value of 50% of the PIG1 voltage at the center, it is determined that "the W1 terminal voltage agrees with 50% of the PIG1 voltage." The predetermined range can be arbitrarily set between 0 and power supply voltage with measurement error and the like taken into account. When it is determined that the W1 terminal voltage agrees with 50% of the PIG1 voltage (S243: YES), the flow proceeds to S251. When it is determined that the W1 terminal voltage does not agree with 50% of the PIG1 voltage (S243: NO), the flow proceeds to S244.

At S244, it is determined whether or not the W1 terminal voltage agrees with 75% of the PIG1 voltage. When it is determined that the W1 terminal voltage does not agree with the 75% of the PIG1 voltage (S244: NO), the flow proceeds to S248. When it is determined that the W1 terminal voltage agrees with 75% of the PIG1 voltage (S244: YES), the flow proceeds to S245.

At S245, the first anomaly counter is incremented. At S246, it is determined whether or not the count on the first anomaly counter is equal to or higher than the predetermined number of times N. When it is determined that the count on the first anomaly counter is not equal to or higher than the predetermined number of times N (S246: NO), the flow returns to S242. When it is determined that the count on the first anomaly counter is equal to or higher than the predetermined number of times N (S246: YES), the flow proceeds to S247. At S247, an open failure in which the W1 lower MOS 26 cannot be brought into conduction is identified. Then the PWM driving of the W1 switching element pair 43 is stopped and the failure detection processing is terminated.

At S248 to which the flow proceeds when it is determined that the W1 terminal voltage does not agree with 75% of the PIG1 voltage (S244: NO), the second anomaly counter is incremented. At S249, it is determined whether or not the count on the second anomaly counter is equal to or higher than the predetermined number of times N. When it is determined that the count on the second anomaly counter is not equal to or higher than the predetermined number of times N (S249: NO), the flow returns to S242. When it is determined that the count on the second anomaly counter is equal to or higher than the predetermined number of times N (S249: YES), the flow proceeds to S250. At S250, an open failure in which the W1 upper MOS 23 cannot be brought into conduction is identified. Then the PWM driving of the W1 switching element pair 43 is stopped and the failure detection processing is terminated.

At S251 to which the flow proceeds when it is determined that the W1 terminal voltage agrees with 50% of the PIG1 voltage (S243: YES), it is concluded that there is no open failure in the W1 switching element pair 43. The first anomaly counter and the second anomaly counter are reset and the PWM driving of the W1 switching element pair 43 is stopped. Then the open failure determination processing is terminated. When a short circuit failure or an open failure is not detected in the MOSs 21 to 26 or the pre-driver 52 by the failure detection processing up to this point, the flow proceeds to S18 in FIG. 3 as mentioned above. Then drive control on the motor 10 by normal PWM control is started.

Description will be given to terminal voltage obtained when there is an open failure. In the following description, the U1 switching element pair 41 will be taken as an example; however, the description also applies to the other switching element pairs.

It will be assumed that: U1 terminal voltage applied by the first voltage application unit 65 when all the MOSs 21 to 26 are out of conduction is $V_{off}$; the PIG1 voltage is $V_{PIG}$; the time for which the U1 upper MOS 21 is on in PWM driving is $T_{on}$; and the time for which the U1 lower MOS 24 is on is $T_{off}$. In this case, the U1 terminal voltage $V_{u1}$ obtained when there is an open failure in the U1 upper MOS 21 is expressed by Expression (1) below:

$$V_{u1} = V_{off} \times T_{on}/(T_{on}+T_{off}) \tag{1}$$

The U1 terminal voltage $V_{u1}$ obtained when there is an open failure in the U1 lower MOS 24 is expressed by Expression (2) below:

$$V_{u1} = (V_{off}+V_{PIG}) \times T_{on}/(T_{on}+T_{off}) \tag{2}$$

When the first voltage application unit 65 is configured of a pull-up resistor, the U1 terminal voltage $V_{off}$ applied by the first voltage application unit 65 when all the MOSs 21 to 26 are out of conduction is expressed by Expression (3) below, where $R_p$ is the resistance value of the pull-up resistor including the first voltage application unit 65 and $R_t$ is the sum of the resistance values including the U1 terminal voltage detection unit 81:

$$V_{off} = V_{PIG} \times R_t/(R_t+R_p) \tag{3}$$

In this embodiment, the pull-up resistance value $R_p$ and the sum $R_t$ of the resistance values including the U1 terminal voltage detection unit are equal to each other. Therefore, the voltage $V_{off}$ applied by the first voltage application unit 65 when all the MOSs 21 to 26 are out of conduction is expressed by Expression (4) below:

$$V_{off} = 0.5 \times V_{PIG} \tag{4}$$

In this embodiment, 50% PWM driving is carried out in open failure detection processing. Therefore, Expression (1) representing the U1 terminal voltage $V_{u1}$ obtained when there is an open failure in the U1 upper MOS 21 can be transformed into Expression (5) below:

$$V_{u1} = V_{PIG} \times 0.5 \times 0.5 \tag{5}$$
$$= V_{PIG} \times 0.25$$

Further, Expression (2) representing the U1 terminal voltage $V_{u1}$ obtained when there is an open failure in the U1 lower MOS 24 can be transformed into Expression (6) below:

$$V_{u1} = (0.5 \times V_{PIG} + V_{PIG}) \times 0.5 \quad (6)$$
$$= 0.75 \times V_{PIG}$$

In this embodiment, therefore, the following measure is taken based on Expression (6) as illustrated in FIG. 6: when the U1 terminal voltage $V_{u1}$ agrees with 75% of the PIG1 voltage $V_{PIG}$, it is concluded that there is an off failure in the U1 lower MOS 24 (S204: YES, S207). The motor driving device may be so configured that the following processing is carried out: in the determination processing at S204, it is determined based on Expression (5) whether or not the U1 terminal voltage $V_{u1}$ agrees with 25% of the PIG1 voltage $V_{PIG}$; when it is determined that the U1 terminal voltage $V_{u1}$ agrees with 25% of the PIG1 voltage $V_{PIG}$, it is concluded that there is an open failure in the U1 upper MOS 21; and when it is determined that the U1 terminal voltage $V_{u1}$ does not agree with 25%, it is determined that there is an open failure in the U1 lower MOS 24.

In the open failure determination processing in this embodiment, an open failure in the U1 switching element pair 41 is identified (FIG. 6), an open failure in the V1 switching element pair 42 is identified (FIG. 7), and then an open failure in the W1 switching element pair 43 is identified (FIG. 8). However, an open failure in any phase may be identified first.

Description will be given to effects (1) to (5) of the motor driving device 1. Here, description will be given mainly to the first inverter unit 20. Since the same failure detection processing is also carried out in the second inverter unit 30, however, the same effects are also obtained there.

(1) In the motor driving device 1, a short circuit failure due to fixation at on or the like in the MOSs 21 to 26 themselves is detected based on terminal voltage and PIG1 voltage before normal PWM control is started. When a short circuit failure in the MOSs 21 to 26 themselves is not detected, a short circuit failure in the pre-driver 52 in which the MOSs 21 to 23 cannot be brought out of conduction is detected based on the following: terminal voltage and PIG1 voltage obtained when all the MOSs 21 to 26 are off-controlled after all the upper MOSs 21 to 23 are on-controlled.

In this embodiment, unlike in PWM control, the upper MOSs 21 to 23 and the lower MOSs 24 to 26 are not periodically switched between on-control and off-control. Instead, a short circuit failure in the pre-driver 52 is detected based on terminal voltage and PIG1 voltage obtained when all the MOSs 21 to 26 are off-controlled after the upper MOSs 21 to 23 are on-controlled (S15 in FIG. 3). Further, a short circuit failure in the pre-driver 52 is detected based on terminal voltage and PIG1 voltage obtained when all the MOSs 21 to 26 are off-controlled after the lower MOSs 24 to 26 are on-controlled (S104 to S107, S114 to S117). As a result, a path through which a current from the upper MOSs 21 to 23 to the lower MOSs 24 to 26 paired therewith is not formed. Therefore, a short circuit failure in the pre-driver 52 can be detected without passage of an overcurrent. Consequently, burnout of each inverter can be restricted. This embodiment is provided with the voltage application units 65, 66 capable of applying voltage to the winding sets 18, 19 with the inverter units 20, 30 bypassed. Therefore, even when the MOSs 21 to 26 are off, terminal voltage can be detected and thus the above-mentioned failure detection processing can be carried out. Since all the upper MOSs 21 to 23 or all the lower MOSs 24 to 26 are simultaneously on-controlled, a failure detection time can be shortened as compared with cases where all the MOSs 21 to 26 are off-controlled after the MOSs 21 to 26 are on-controlled one by one.

(2) The motor driving device 1 includes the first inverter unit 20 and the second inverter unit 30. The failure detection processing for detecting any failure in the MOSs 21 to 26 and the pre-driver 52 is carried out at the control unit 50 with the first inverter unit 20 and the first winding set 18 electrically connected with each other. The failure detection processing for detecting any failure in the MOSs 31 to 36 and the pre-driver 52 is carried out with the second inverter unit and the second winding set 19 electrically connected with each other.

In this embodiment, a short circuit failure in the pre-driver 52 is detected by off-controlling all the MOSs 21 to 26 after on-controlling the upper MOs S21 to 23 at the first inverter unit 20 and as a result, an overcurrent does not flow. Therefore, a short circuit failure can be detected with the first winding set 18 and the first inverter unit 20 electrically connected with each other. This obviates necessity for a motor relay and contributes to size reduction of the motor driving device. The inverter units are configured in multiple systems. Therefore, even though there is no motor relay, there is a failure in any of the MOSs 21 to 26, 31 to 36, and a regenerative brake is produced, it is possible to cover driving force equivalent to the regenerative brake in a sound system.

In this embodiment, the failure detection processing is independently carried out in the first inverter unit 20 and in the second inverter unit 30. The failure detection processing can be simultaneously carried out in the individual systems.

(3) When a short circuit failure is not detected in the MOSs 21 to 26 and a short circuit failure in the pre-driver 52 in which the MOSs 21 to 26 cannot be turned off is not detected, an open failure is detected. This is a failure in which the MOSs 21 to 26 cannot be brought into conduction. The open failure detection processing is carried out with respect to each of the switching element pairs 41 to 43. In the switching element pairs 41 to 43, the same open failure detection processing is carried out. Therefore, here, description will be given to effects obtained when the open failure detection is carried out in the switching element pair 41. The same effects are also obtained in the switching element pairs 42, 43.

In 50% PWM driving, the following states are periodically switched in the switching element pair 41: a state in which the upper MOS 21 is on-controlled and the lower MOS 24 is off-controlled and a state in which the upper MOS 21 is off-controlled and the lower MOS 24 is on-controlled. When the value obtained by multiplying the PIG1 voltage by a rate of on-control of the upper MOS 21, that is, 50% and the U1 terminal voltage do not agree with each other (S203: NO), an open failure is detected. In this open failure, at least either of the upper MOS 21 and the lower MOS 24 cannot be brought into conduction. The open failure detection processing is carried out after it is concluded that there is no short circuit failure in the MOSs 21 to 26 or the pre-driver 52. Therefore, even though PWM driving is carried out, an overcurrent does not flow from the upper MOSs 21 to 23 to the lower MOSs 24 to 26 paired therewith and thus burnout can be restricted.

When the U1 terminal voltage obtained when 50% PWM driving is carried out in the switching element pair 41 and 75% of the PIG1 voltage agree with each other (S204: YES), an open failure in the lower MOS 24 is identified (S207). When the U1 terminal voltage and 75% of the PIG1 voltage do not agree with each other (S204: NO), an open failure in the U1 upper MOS 21 is identified. This makes it possible to identify a point of open failure and thus failure analyses are facilitated and a number of man-hours for repair can be reduced.

In the example illustrated in FIG. 6, when the U1 terminal voltage does not agree with 50% of the PIG1 voltage (S203: NO), an open failure is identified as described below. When the U1 terminal voltage agrees with 75% of the PIG1 voltage (S204: YES), it is concluded that there is an open failure in the U1 lower MOS 24 (S207). When the U1 terminal voltage does not agree with 75% of the PIG1 voltage (S204: NO), it is concluded that there is an open failure in the U1 upper MOS 21 (S210). Instead, an open failure may be identified as follows when the U1 terminal voltage does not agree with 50% of the PIG1 voltage (S203: NO): when it does not agree with 25% of the U1 terminal voltage, an open failure in the U1 upper MOS 21 is identified; and when it does not agree with 25% of the U1 terminal voltage, an open failure in the U1 lower MOS 24 is identified. Also with this configuration, a point of open failure can be identified. Therefore, failure analyses are facilitated and a number of man-hours for repair can be reduced.

(4) When it is determined that the rotation of the motor 10 is at a stop (S12: YES, S103: YES, S113: YES, S202: YES, S222: YES, S244: YES) in this embodiment, failure detection processing is carried out on the MOSs 21 to 26 and the pre-driver 52. For example, when the steering wheel 91 is operated by a user, the motor 10 is rotated and there is a possibility that terminal voltage is caused to fluctuate by the production of back electromotive voltage. In this embodiment, failure determination is carried out based on terminal voltage and PIG1 voltage obtained when the rotation of the motor 10 is at a stop. Therefore, accurate failure determination can be carried out.

(5) The motor driving device 1 in this embodiment is used in the electric power steering device 100. The electric power steering device 100 governs "turning" of the three major functions (running, turning, and stopping) of vehicles and it is a system any failure of which can lead to a serious accident. In this embodiment, any failure in the MOSs 21 to 26 and the pre-driver 52 can be detected without passage of an overcurrent before normal PWM control is started; therefore, the motor driving device contributes to the enhancement of safety.

The control unit 50 in this embodiment may function as "rotation control unit," "first failure detection unit," "second failure detection unit," "third failure detection unit," and "stop determining unit." S18 in FIG. 3 may correspond to processing as functions of the "rotation control unit" and S13 to S15 may correspond to processing as functions of the "first failure detection unit." S104 to S107 in FIG. 4 and S114 to S117 in FIG. 5 may correspond to processing as functions of the "second failure detection unit." S203 to S210 in FIG. 6, S223 to S230 in FIG. 7, and S243 to S250 in FIG. 8 may correspond to processing as functions of the "third failure detection unit." S12 in FIG. 3, S103 in FIG. 4, S113 in FIG. 5, S202 in FIG. 6, S222 in FIG. 7, and S242 in FIG. 8 may correspond to processing as functions of the "stop determining unit."

Second Embodiment

The circuitry and the like of the electric power steering device 100 and the motor driving device 1 in the second embodiment of the motor driving device are the same as those in the first embodiment and the description thereof will be omitted. Here, description will be given only to failure detection processing. As in the first embodiment, the failure detection processing in the first inverter unit 20 and the failure detection processing in the second inverter unit 30 are identical with each other; therefore, the failure detection processing in the first inverter unit 20 will be described here. The failure detection processing in the first inverter unit 20 and the failure detection processing in the second inverter unit 30 can be simultaneously carried out.

Figure 9:
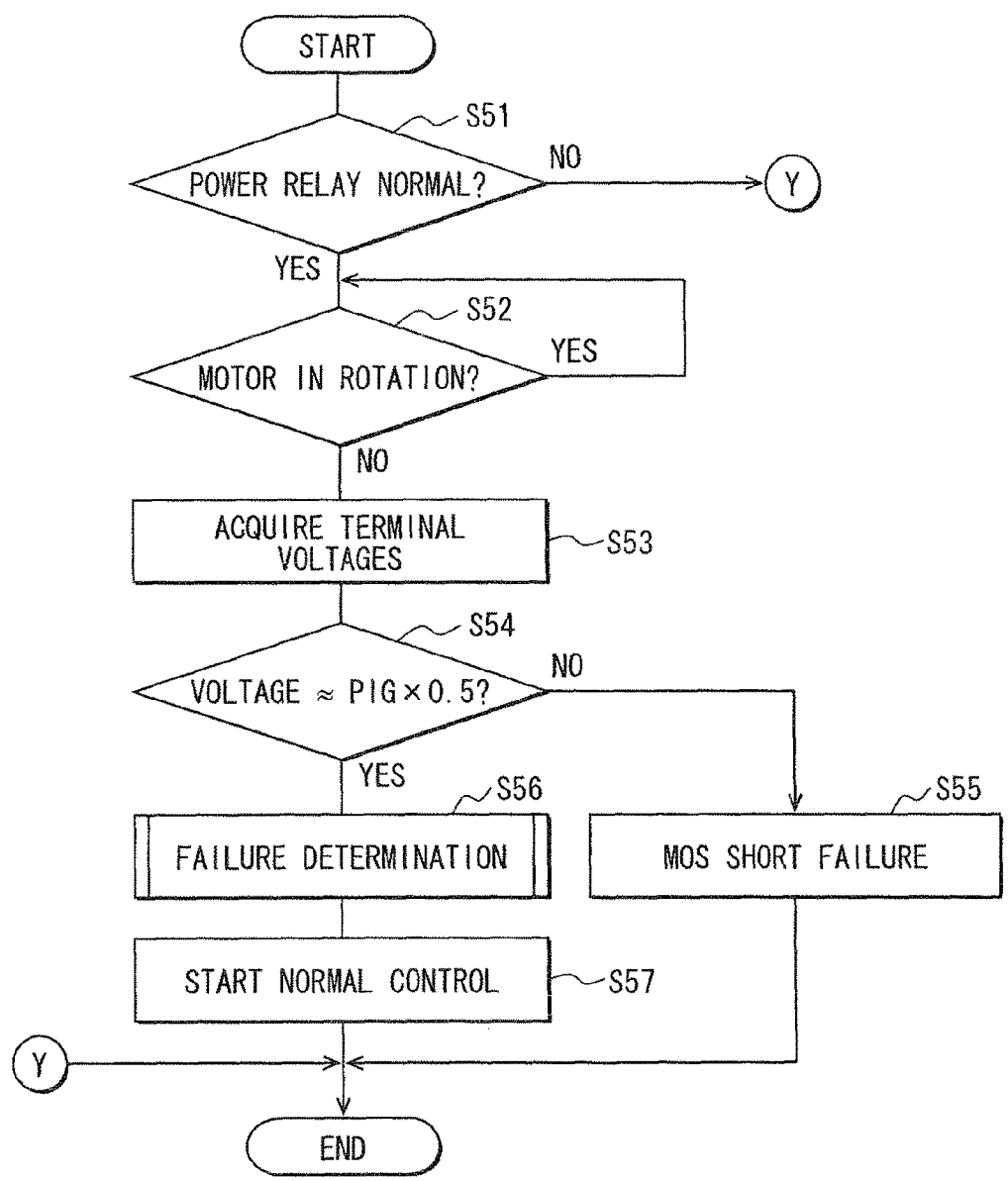
FIG. 9 is a flowchart illustrating failure detection processing in a second embodiment of the invention.

Description will be given to the main flow of the failure detection processing illustrated in FIG. 9. The failure detection processing illustrated in FIG. 9 is carried out when the ignition switch 58 is turned on. At S51, it is determined whether or not the first power supply relay 61 is normal. When it is determined that the first power supply relay 61 is not normal (S51: NO), the processing of S52 and the following steps is not carried out. When it is determined that the first power supply relay 61 is normal (S51: YES), the flow proceeds to S52.

At S52, it is determined based on the rotational position θ acquired form the rotation angle sensor whether or not the motor 10 is rotating. When it is determined that the motor 10 is rotating (S52: YES), this determination processing is repeated. When it is determined that the motor 10 is not rotating (352: NO), the flow proceeds to S53.

At S53, the U1 terminal voltage, V1 terminal voltage, and W1 terminal voltage are acquired. At S54, it is determined whether or not each of the U1 terminal voltage, V1 terminal voltage, and W1 terminal voltage agrees with 50% of the PIG1 voltage. This determination processing is the same as that of S14 in the first embodiment. When it is determined that each of the U1 terminal voltage, V1 terminal voltage, and W1 terminal voltage agrees with 50% of the PIG1 voltage (S54: YES), the short circuit failure determination processing of S56 is carried out. When it is determined that any of the U1 terminal voltage, V1 terminal voltage, and W1 terminal voltage does not agree with 50% of the PIG1 voltage (S54: NO), the flow proceeds to S55.

At S55, it is concluded that a short circuit failure has occurred in at least one of the MOSs 21 to 26. When a terminal voltage is higher than output of 50% of the PIG1 voltage and substantially agrees with the PIG1 voltage, it can be concluded that a short circuit failure has occurred in at least one of the upper MOSs 21 to 23. When a terminal voltage is lower than output of 50% of the PIG1 voltage or and substantially equal to zero, it can be concluded that a short circuit failure has occurred in at least one of the lower MOSs 24 to 26.

In this embodiment, it is determined at S54 that a "terminal voltage agrees with 50% of the PIG1 voltage" in the following cases: cases where the terminal voltage is within a predetermined range with a value obtained by multiplying the PIG1 voltage by ½ at the center. When a short circuit failure has occurred in an upper MOS, as mentioned above, the terminal voltage substantially agrees with the PIG1 voltage; and when a short circuit failure has occurred in a lower MOS, the terminal voltage substantially agrees with zero. Therefore, the predetermined range with the 50% output of the PIG1 voltage used at S14 can be arbitrarily set between 0 and power supply voltage with measurement error and the like taken into account.

At S56 to which the flow proceeds when it is determined that the U1 terminal voltage, V1 terminal voltage, and W1 terminal voltage agree with 50% of the PIG1 voltage (S54: YES), failure determination processing is carried out. The failure determination processing carried out at S16 will be described later. At S57 to which the flow proceeds when a failure is not detected in the failure determination processing carried out at S56, drive control on the motor 10 by normal PWM control is started.

Figure 10:
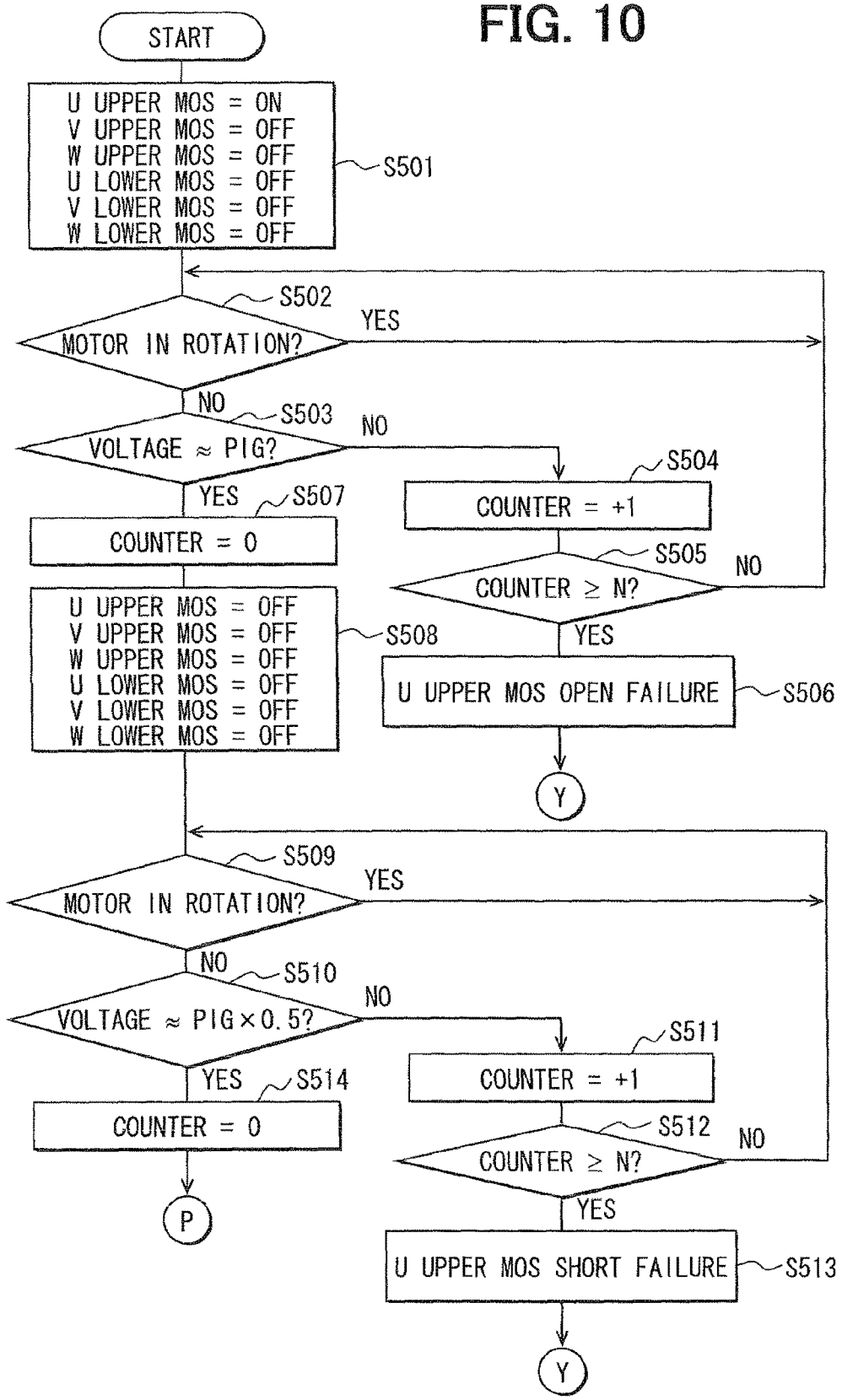
FIG. 10 is a flowchart illustrating the failure detection processing in the second embodiment of the invention.
Figure 11:
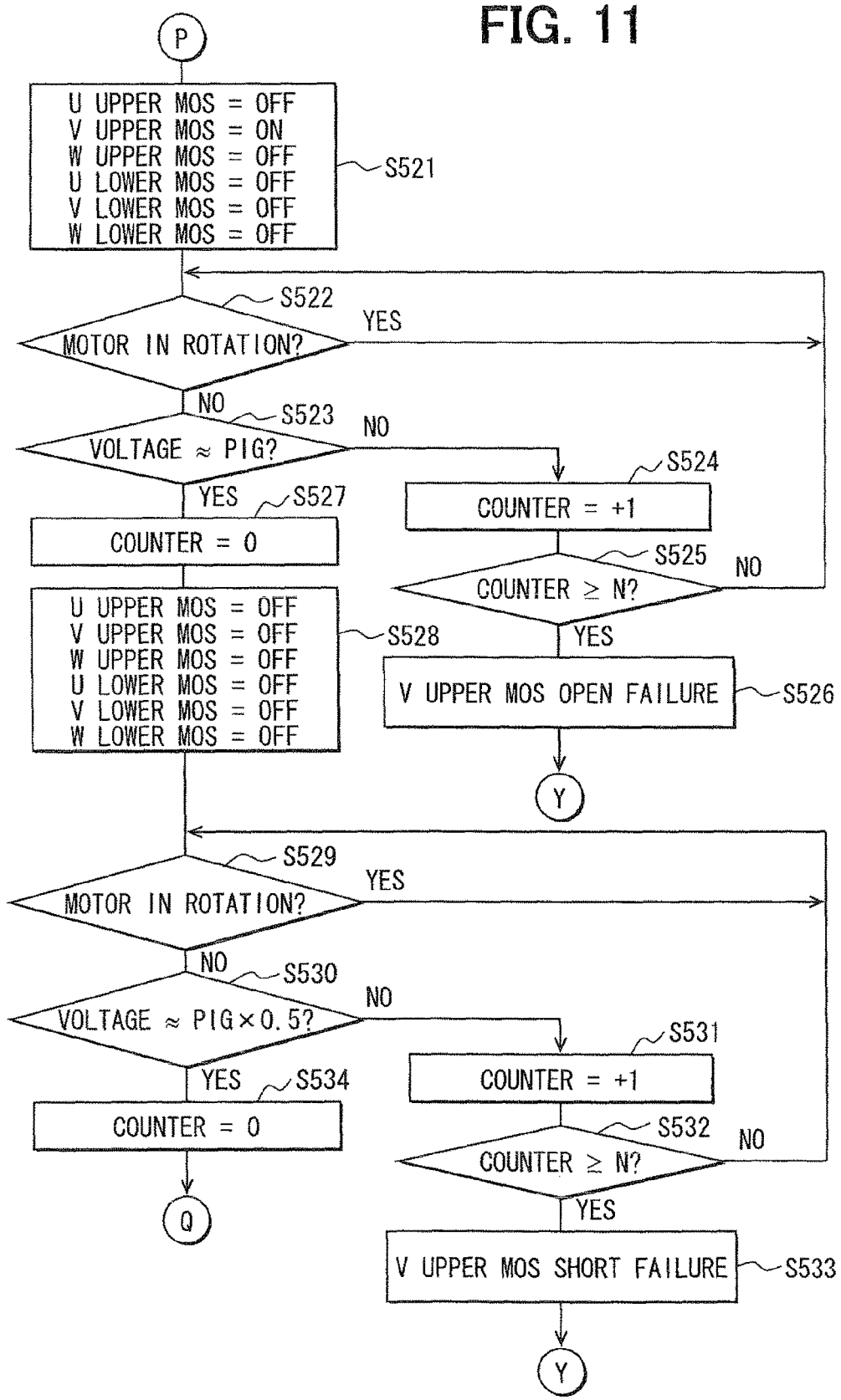
FIG. 11 is a flowchart illustrating the failure detection processing in the second embodiment of the invention.
Figure 12:
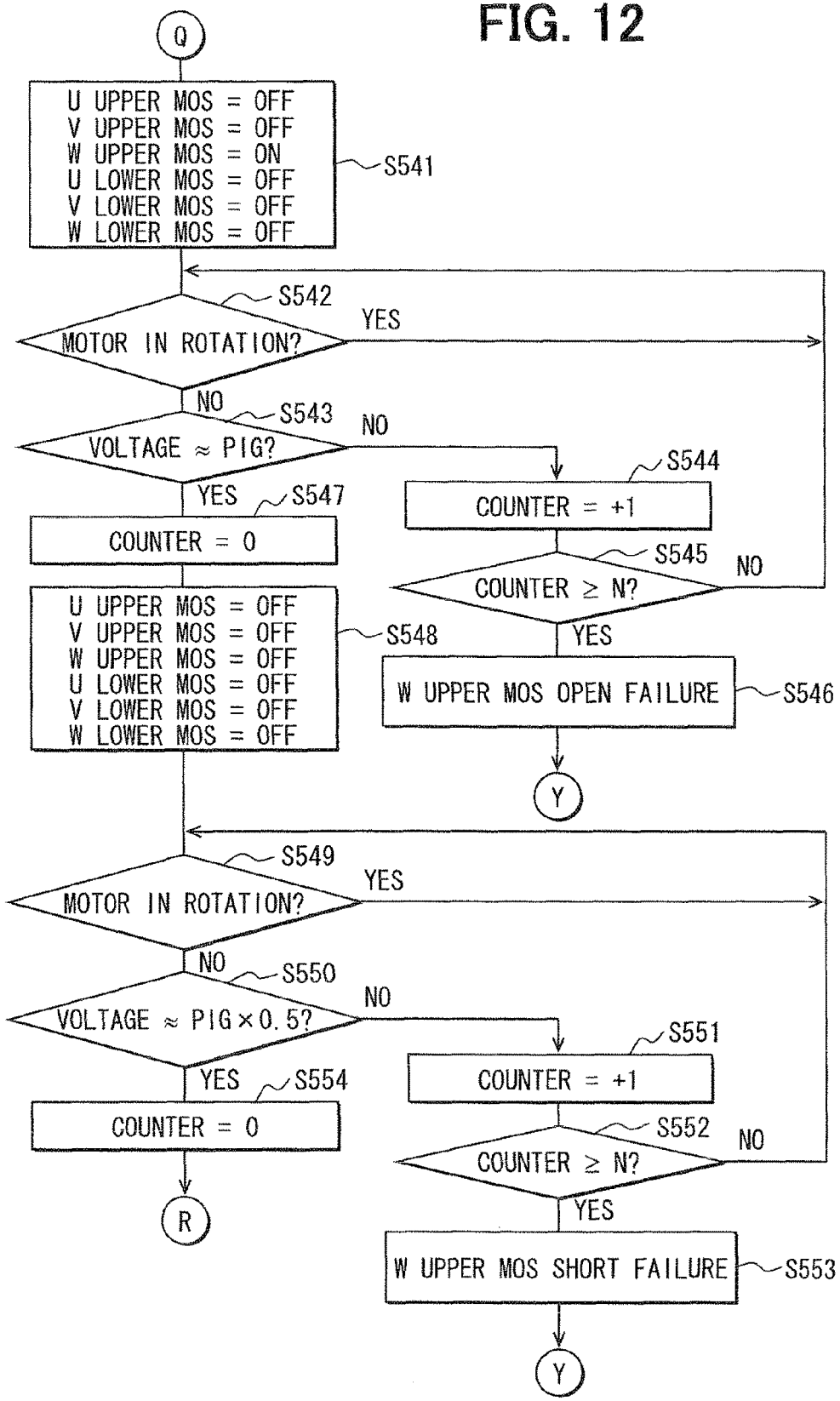
FIG. 12 is a flowchart illustrating the failure detection processing in the second embodiment of the invention.
Figure 13:
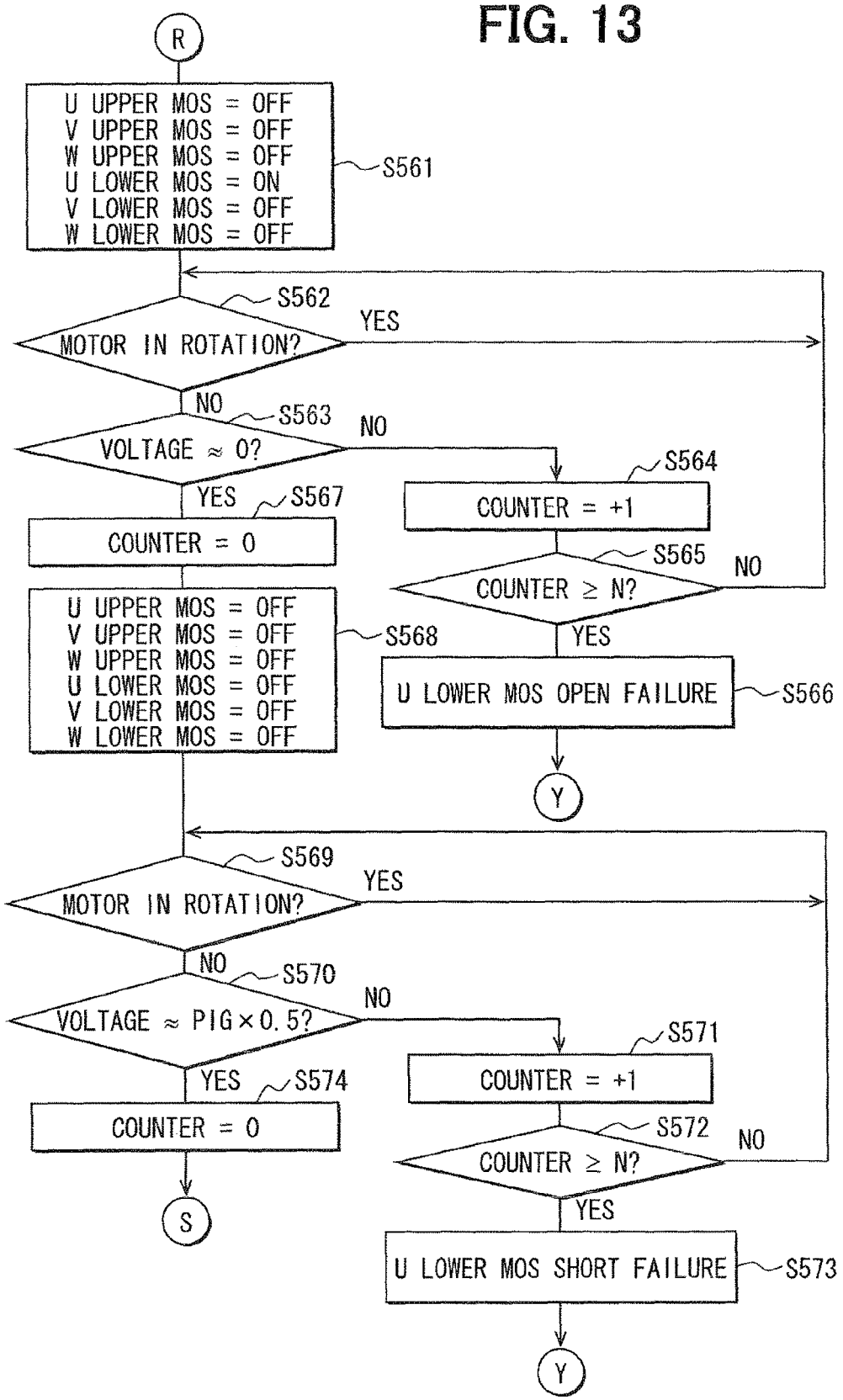
FIG. 13 is a flowchart illustrating the failure detection processing in the second embodiment of the invention.
Figure 14:
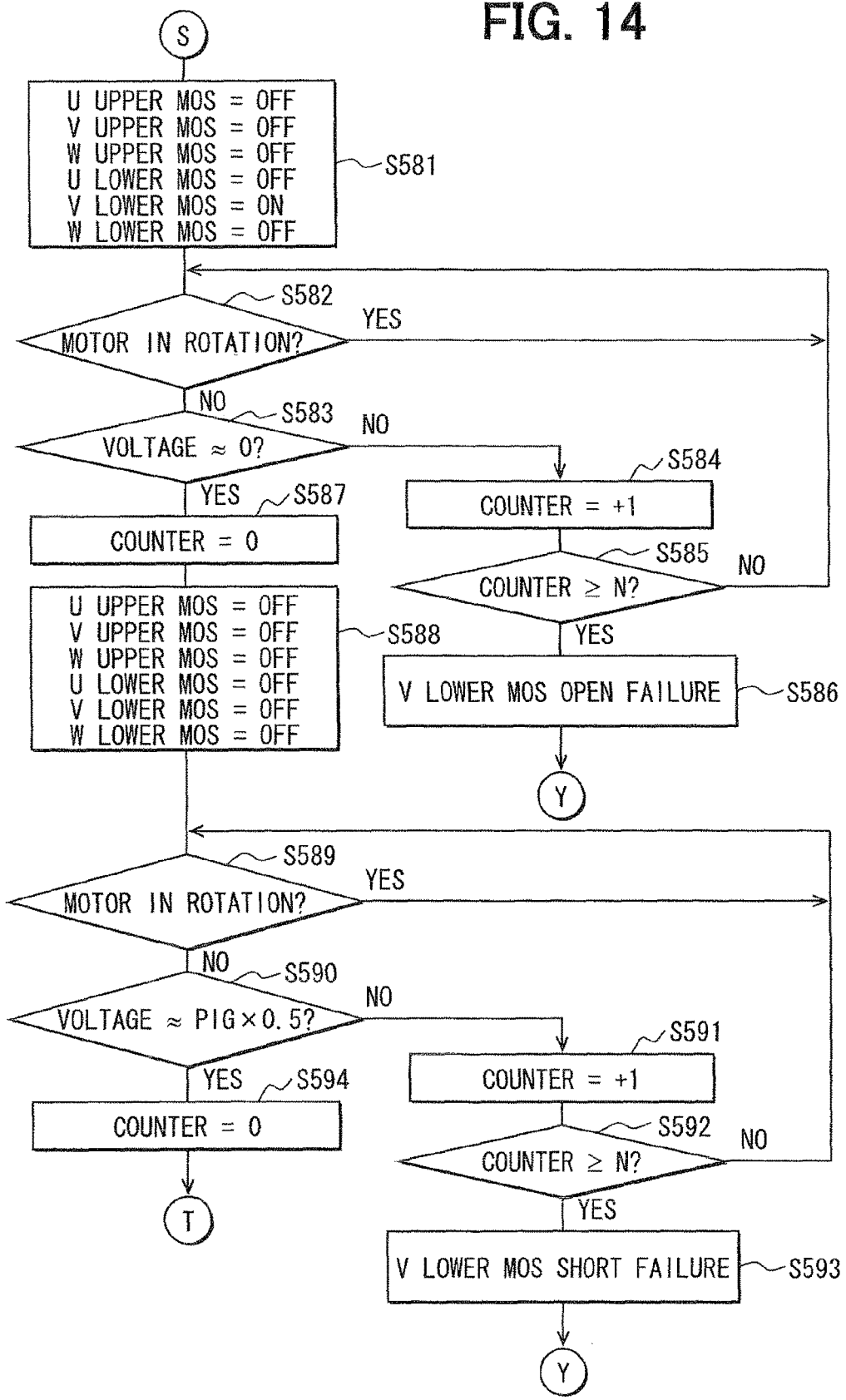
FIG. 14 is a flowchart illustrating the failure detection processing in the second embodiment of the invention.
Figure 15:
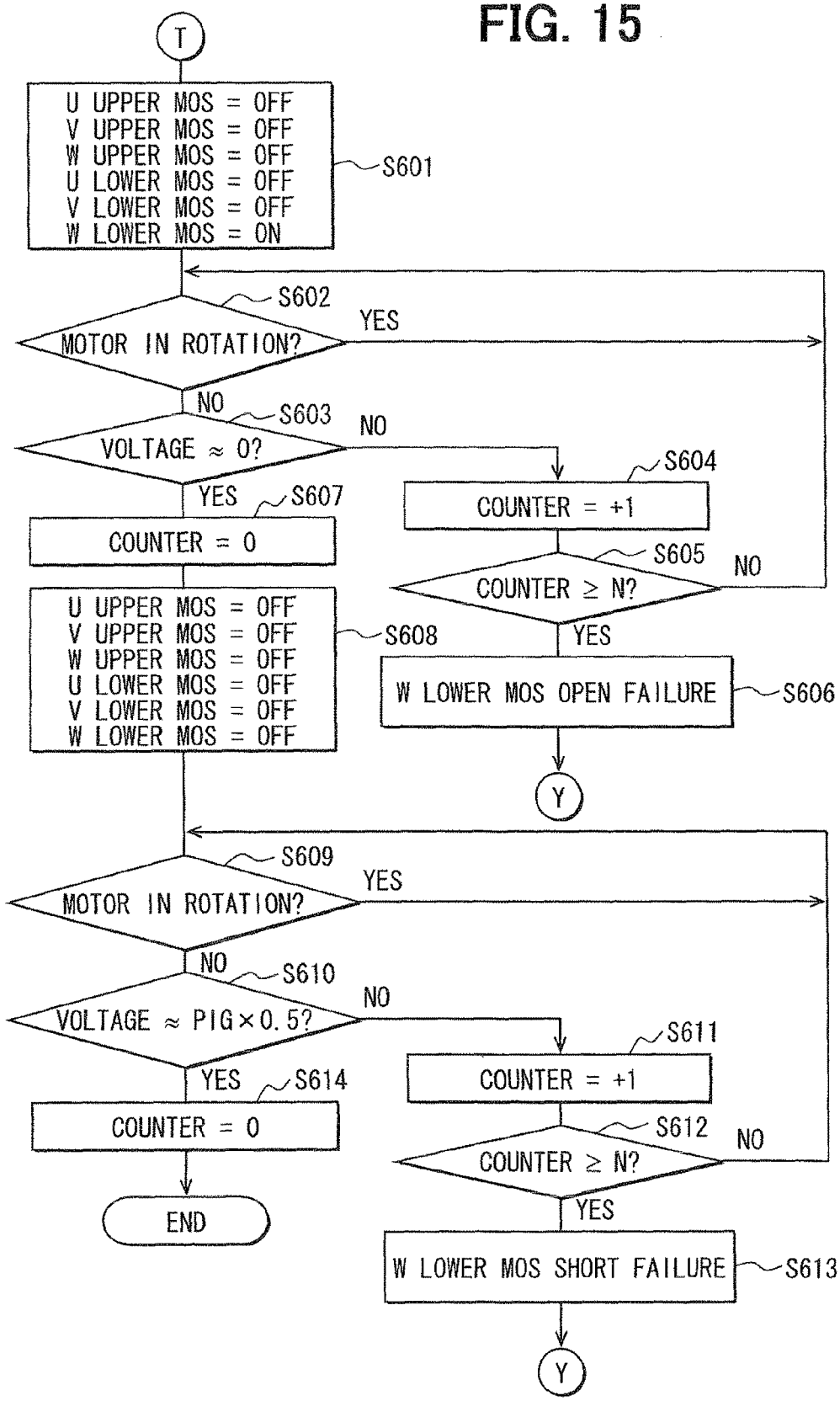
FIG. 15 is a flowchart illustrating the failure detection processing in the second embodiment of the invention.

Description will be given to the failure determination processing at S56 with reference to FIG. 10 to FIG. 15. FIG. 10 illustrates processing for detecting any failure in the U1 upper MOS 21; FIG. 11 illustrates processing for detecting any failure in the V1 upper MOS 22; and FIG. 12 illustrates processing for detecting any failure in the W1 upper MOS 23. FIG. 13 illustrates processing for detecting any failure in the U1 lower MOS 24; FIG. 14 illustrates processing for detecting any failure in the V1 lower MOS 25; and FIG. 15 illustrates processing for detecting any failure in the W1 lower MOS 26.

At the first step, S501, in FIG. 10, the U1 upper MOS 21 is on-controlled through the pre-driver 52. At this time, all the MOSs 22 to 26, other than the U1 upper MOS 21, in the first inverter unit 20 remain off. It has been concluded that there is no short circuit failure in the U1 lower MOS 24. Even through the U1 upper MOS 21 is on-controlled, therefore, an overcurrent does not flow from the U1 upper MOS 21 to the U1 lower MOS 24.

At S502, it is determined based on the rotational position θ acquired from the rotation angle sensor whether or not the motor 10 is rotating. When it is determined that the motor 10 is rotating (S502: YES), this determination processing is repeated. When it is determined that the motor 10 is not rotating (S502: NO), the flow proceeds to S503.

At S503, it is determined whether or not the U1 terminal voltage agrees with the PIG1 voltage. When it is determined that the U1 terminal voltage agrees with the PIG1 voltage (S503: YES), the flow proceeds to S507. When it is determined that the U1 terminal voltage does not agree with the PIG1 voltage (S503: NO), the flow proceeds to S504.

At S504, an anomaly counter is incremented. At S505, it is determined whether or not the count on the anomaly counter is equal to or higher than a predetermined number of times N. When it is determined that the count on the anomaly counter is not equal to or higher than the predetermined number of times N (S505: NO), the flow returns to S502. When it is determined that the count on the anomaly counter is equal to or higher than the predetermined number of times N (S505: YES), the flow proceeds to S506. At S506, it is concluded that an open failure in which the U1 upper MOS 21 cannot be brought into conduction has occurred and the failure detection processing is terminated.

At S507 to which the flow proceeds when it is determined that the U1 terminal voltage agrees with the PIG1 voltage (S503: YES), it is concluded that the following open failure has not occurred in the U1 upper MOS 21 or the pre-driver 52: an open failure in which the U1 upper MOS 21 cannot be brought into conduction. Then the anomaly counter is reset.

At S508, the U1 upper MOS 21 on-controlled at S501 is off-controlled. That is, all the MOSs 21 to 26 are turned off. At S509, it is determined based on the rotational position θ acquired from the rotation angle sensor whether or not the motor 10 is rotating. When it is determined that the motor 10 is rotating (S509: YES), this determination processing is repeated. When it is determined that the motor 10 is not rotating (S509: NO), the flow proceeds to S510.

At S510, it is determined whether or not the U1 terminal voltage agrees with 50% of the PIG1 voltage. When the U1 terminal voltage is within a predetermined range with an output value of 50% of the PIG1 voltage at the center, it is determined that "the U1 terminal voltage agrees with 50% of the PIG1 voltage." The predetermined range can be arbitrarily set between 0 and power supply voltage with measurement error and the like taken into account. When the U1 terminal voltage agrees with 50% of the PIG1 voltage (S510: YES), the flow proceeds to S514. When the U1 terminal voltage does not agree with 50% of the PIG1 voltage (S510: NO), the flow proceeds to S511.

At S511, the anomaly counter is incremented. At S512, it is determined whether or not the count on the anomaly counter is equal to or higher than the predetermined number of times N. When it is determined that the count on the anomaly counter is not equal to or higher than the predetermined number of times N (S512: NO), the flow returns to S509. When it is determined that the count on the anomaly counter is equal to or higher than the predetermined number of times N (S512: YES), the flow proceeds to S513. At S513, it is concluded that a short circuit failure in which the U1 upper MOS 21 cannot be brought out of conduction has occurred in the pre-driver 52 and the failure detection processing is terminated.

At S514 to which the flow proceeds when it is determined that the U1 terminal voltage agrees with 50% of the PIG1 voltage (S510: YES), it is concluded that the following short circuit failure has not occurred in the pre-driver 52: a short circuit failure in which the U1 upper MOS 21 cannot be brought out of conduction. Then the anomaly counter is reset and the flow proceeds to S521 in FIG. 11.

At S521 in FIG. 11, the V1 upper MOS 22 is on-controlled through the pre-driver 52. At this time, all the MOSs 21, 23 to 26, other than the V1 upper MOS 22, in the first inverter unit 20 remain off. It has been concluded that there is no short circuit failure in the V1 lower MOS 25. Even though the V1 upper MOS 22 is on-controlled, therefore, an overcurrent does not flow from the V1 upper MOS 22 to the V1 lower MOS 25.

At S522, it is determined based on the rotational position θ acquired from the rotation angle sensor whether or not the motor 10 is rotating. When it is determined that the motor 10 is rotating (S522: YES), this determination processing is repeated. When it is determined that the motor 10 is not rotating (S522: NO), the flow proceeds to S523.

At S523, it is determined whether or not the V1 terminal voltage agrees with the PIG1 voltage. When it is determined that the V1 terminal voltage agrees with the PIG1 voltage (S523: YES), the flow proceeds to S527. When it is determined that the V1 terminal voltage does not agree with the PIG1 voltage (S523: NO), the flow proceeds to S524.

At S524, the anomaly counter is incremented. At S525, it is determined whether or not the count on the anomaly counter is equal to or higher than the predetermined number of times N. When it is determined that the count on the anomaly counter is not equal to or higher than the predetermined number of times N (S525: NO), the flow returns to S522. When it is determined that the count on the anomaly counter is equal to or higher than the predetermined number of times N (S525: YES), the flow proceeds to S526. At S526, it is concluded that an open failure in which the V1 upper MOS 22 cannot be brought into conduction has occurred and the failure detection processing is terminated.

At S527 to which the flow proceeds when it is determined that the V1 terminal voltage agrees with the PIG1 voltage (S523: YES), it is concluded that the following open failure has not occurred in the V1 upper MOS 22 or the pre-driver 52: an open failure in which the V1 upper MOS 22 cannot be brought into conduction. Then the anomaly counter is reset.

At S528, the V1 upper MOS 22 on-controlled at S521 is off-controlled. That is, all the MOSs 21 to 26 are turned off. At S529, it is determined based on the rotational position θ acquired from the rotation angle sensor whether or not the motor 10 is rotating. When it is determined that the motor 10 is rotating (S529: YES), this determination processing is repeated. When it is determined that the motor 10 is not rotating (S529: NO), the flow proceeds to S530.

At S530, it is determined whether or not the V1 terminal voltage agrees with 50% of the PIG1 voltage. When the V1 terminal voltage is within a predetermined range with an output value of 50% of the PIG1 voltage at the center, it is determined that "the V1 terminal voltage agrees with 50% of the PIG1 voltage." The predetermined range can be arbitrarily set between 0 and power supply voltage with measurement error and the like taken into account. When the V1 terminal voltage agrees with 50% of the PIG1 voltage (S530: YES), the flow proceeds to S534. When the V1 terminal voltage does not agree with 50% of the PIG1 voltage (S530: NO), the flow proceeds to S531.

At S531, the anomaly counter is incremented. At S532, it is determined whether or not the count on the anomaly counter is equal to or higher than the predetermined number of times N. When it is determined that the count on the anomaly counter is not equal to or higher than the predetermined number of times N (S532: NO), the flow returns to S529. When it is determined that the count on the anomaly counter is equal to or higher than the predetermined number of times N (S532: YES), the flow proceeds to S533. At S533, it is concluded that a short circuit failure in which the V1 upper MOS 22 cannot be brought out of conduction has occurred in the pre-driver 52 and the failure detection processing is terminated.

At S534 to which the flow proceeds when it is determined that the V1 terminal voltage agrees with 50% of the PIG1 voltage (S530: YES), it is concluded that the following short circuit failure has not occurred in the pre-driver 52: a short circuit failure in which the V1 upper MOS 22 cannot be brought out of conduction. Then the anomaly counter is reset and the flow proceeds to S541 in FIG. 12.

At S541 in FIG. 12, the W1 upper MOS 23 is on-controlled through the pre-driver 52. At this time, all the MOSs 21, 22, 24 to 26, other than the W1 upper MOS 23, in the first inverter unit 20 remain off. It has concluded that there is no short circuit failure in the W1 lower MOS 26. Even though the W1 upper MOS 23 is on-controlled, therefore, an overcurrent does not flow from the W1 upper MOS 23 to the W1 lower MOS 26.

At S542, it is determined based on the rotational position θ acquired from the rotation angle sensor whether or not the motor 10 is rotating. When it is determined that the motor 10 is rotating (S542: YES), this determination processing is repeated. When it is determined that the motor 10 is not rotating (S542: NO), the flow proceeds to S543.

At S543, it is determined whether or not the W1 terminal voltage agrees with the PIG1 voltage. When it is determined that the W1 terminal voltage agrees with the PIG1 voltage (S543: YES), the flow proceeds to S547. When it is determined that the W1 terminal voltage does not agree with the PIG1 voltage (S543: NO), the flow proceeds to S544.

At S544, the anomaly counter is incremented. At S545, it is determined whether or not the count on the anomaly counter is equal to or higher than the predetermined number of times N. When it is determined that the count on the anomaly counter is not equal to or higher than the predetermined number of times N (S545: NO), the flow returns to S542. When it is determined that the count on the anomaly counter is equal to or higher than the predetermined number of times N (S545: YES), the flow proceeds to S546. At S546, it is concluded that an open failure in which the W1 upper MOS 23 cannot be brought into conduction has occurred and the failure detection processing is terminated.

At S547 to which the flow proceeds when it is determined that the W1 terminal voltage agrees with the PIG1 voltage (S543: YES), it is concluded that the following open failure has not occurred in the W1 upper MOS 23 or the pre-driver 52: an open failure in which the W1 upper MOS 23 cannot be brought into conduction. Then the anomaly counter is reset.

At S548, the W1 upper MOS 23 on-controlled at S541 is off-controlled. That is, all the MOSs 21 to 26 are turned off. At S549, it is determined based on the rotational position θ acquired from the rotation angle sensor whether or not the motor 10 is rotating. When it is determined that the motor 10 is rotating (S549: YES), this determination processing is repeated. When it is determined that the motor 10 is not rotating (S549: NO), the flow proceeds to S550.

At S550, it is determined whether or not the W1 terminal voltage agrees with 50% of the PIG1 voltage. When the W1 terminal voltage is within a predetermined range with an output value of 50% of the PIG1 voltage at the center, it is determined that "the W1 terminal voltage agrees with 50% of the PIG1 voltage." The predetermined range can be arbitrarily set between 0 and power supply voltage with measurement error and the like taken into account. When the W1 terminal voltage agrees with 50% of the PIG1 voltage (S550: YES), the flow proceeds to S554. When the W1 terminal voltage does not agree with 50% of the PIG1 voltage (S550: NO), the flow proceeds to S551.

At S551, the anomaly counter is incremented. At S552, it is determined whether or not the count on the anomaly counter is equal to or higher than the predetermined number of times N. When it is determined that the count on the anomaly counter is not equal to or higher than the predetermined number of times N (S552: NO), the flow returns to S549. When it is determined that the count on the anomaly counter is equal to or higher than the predetermined number of times N (S552: YES), the flow proceeds to S553. At S553, it is concluded that a short circuit failure in which the W1 upper MOS 23 cannot be brought out of conduction has occurred in the pre-driver 52 and the failure detection processing is terminated.

At S554 to which the flow proceeds when it is determined that the W1 terminal voltage agrees with 50% of the PIG1 voltage (S550: YES), it is concluded that the following short circuit failure has not occurred in the pre-driver 52: a short circuit failure in which the W1 upper MOS 23 cannot be brought out of conduction. Then the anomaly counter is reset and the flow proceeds to S561 in FIG. 13.

At S561 in FIG. 13, the U1 lower MOS 24 is on-controlled through the pre-driver 52. At this time, all the MOSs 21 to 23, 25, 26, other than the U1 lower MOS 24, in the first inverter unit 20 remain off. It has been concluded that there is no short circuit failure in the U1 upper MOS 21. Even though the U1 lower MOS 24 is on-controlled, therefore, an overcurrent does not flow from the U1 upper MOS 21 to the U1 lower MOS 24.

At S562, it is determined based on the rotational position θ acquired from the rotation angle sensor whether or not the motor 10 is rotating. When it is determined that the motor 10 is rotating (S562: YES), this determination processing is repeated. When it is determined that the motor 10 is not rotating (S562: NO), the flow proceeds to S563.

At S563, it is determined whether or not the U1 terminal voltage is zero. When it is determined that the U1 terminal voltage is zero (S563: YES), the flow proceeds to S567. When it is determined that the U1 terminal voltage is not zero (S563: NO), the flow proceeds to S564.

At S564, the anomaly counter is incremented. At S565, it is determined whether or not the count on the anomaly counter is equal to or higher than the predetermined number of times N. When it is determined that the count on the anomaly counter is not equal to or higher than the predetermined number of times N (S565: NO), the flow returns to S562. When it is determined that the count on the anomaly counter is equal to or higher than the predetermined number of times N (S565: YES), the flow proceeds to S566. At S566, it is concluded that an open failure in which the U1 lower MOS 24 cannot be brought into conduction has occurred and the failure detection processing is terminated.

At S567 to which the flow proceeds when it is determined that the U1 terminal voltage is zero (S563: YES), it is concluded that the following open failure has not occurred in the U1 lower MOS 24 or the pre-driver 52: an open failure in which the U1 lower MOS 24 cannot be brought into conduction. Then the anomaly counter is reset.

At S568, the U1 lower MOS 24 on-controlled at S561 is off-controlled. That is, all the MOSs 21 to 26 are turned off. At S569, it is determined based on the rotational position θ acquired from the rotation angle sensor whether or not the motor 10 is rotating. When it is determined that the motor 10 is rotating (S569: YES), this determination processing is repeated. When it is determined that the motor 10 is not rotating (S569: NO), the flow proceeds to S570.

At S570, it is determined whether or not the U1 terminal voltage agrees with 50% of the PIG1 voltage. When the U1 terminal voltage is within a predetermined range with an output value of 50% of the PIG1 voltage at the center, it is determined that "the U1 terminal voltage agrees with 50% of the PIG1 voltage." The predetermined range can be arbitrarily set between 0 and power supply voltage with measurement error and the like taken into account. When the U1 terminal voltage agrees with 50% of the PIG1 voltage (S570: YES), the flow proceeds to S574. When the U1 terminal voltage does not agree with 50% of the PIG1 voltage (S570: NO), the flow proceeds to S571.

At S571, the anomaly counter is incremented. At S572, it is determined whether or not the count on the anomaly counter is equal to or higher than the predetermined number of times N. When it is determined that the count on the anomaly counter is not equal to or higher than the predetermined number of times N (S572: NO), the flow returns to S569. When it is determined that the count on the anomaly counter is equal to or higher than the predetermined number of times N (S572: YES), the flow proceeds to S573. At S573, it is concluded that a short circuit failure in which the U1 lower MOS 24 cannot be brought out of conduction has occurred in the pre-driver 52 and the failure detection processing is terminated.

At S574 to which the flow proceeds when it is determined that the U1 terminal voltage agrees with 50% of the PIG1 voltage (S570: YES), it is concluded that the following short circuit failure has not occurred in the pre-driver 52: a short circuit failure in which the U1 lower MOS 24 cannot be brought out of conduction. Then the anomaly counter is reset and the flow proceeds to S581 in FIG. 14.

At S581 in FIG. 14, the V1 lower MOS 25 is on-controlled through the pre-driver 52. At this time, all the MOSs 21 to 24, 26, other than the V1 lower MOS 25, in the first inverter unit 20 remain off. It has been concluded that there is no short circuit failure in the V1 upper MOS 22. Even though the V1 lower MOS 25 is on-controlled, therefore, an overcurrent does not flow from the V1 upper MOS 22 to the V1 lower MOS 25.

At S582, it is determined based on the rotational position θ acquired from the rotation angle sensor whether or not the motor 10 is rotating. When it is determined that the motor 10 is rotating (S582: YES), this determination processing is repeated. When it is determined that the motor 10 is not rotating (S582: NO), the flow proceeds to S583.

At S583, it is determined whether or not the V1 terminal voltage is zero. When it is determined that the V1 terminal voltage is zero (S583: YES), the flow proceeds to S587. When it is determined that the V1 terminal voltage is not zero (S583: NO), the flow proceeds to S584.

At S584, the anomaly counter is incremented. At S585, it is determined whether or not the count on the anomaly counter is equal to or higher than the predetermined number of times N. When it is determined that the count on the anomaly counter is not equal to or higher than the predetermined number of times N (S585: NO), the flow returns to S582. When it is determined that the count on the anomaly counter is equal to or higher than the predetermined number of times N (S585: YES), the flow proceeds to S586. At S586, it is concluded that an open failure in which the V1 lower MOS 25 cannot be brought into conduction has occurred and the failure detection processing is terminated.

At S587 to which the flow proceeds when it is determined that the V1 terminal voltage is zero (S583: YES), it is concluded that the following open failure has not occurred in the V1 lower MOS 25 or the pre-driver 52: an open failure in which the V1 lower MOS 25 cannot be brought into conduction. Then the anomaly counter is reset.

At S588, the V1 lower MOS 25 on-controlled at S581 is off-controlled. That is, all the MOSs 21 to 26 are turned off. At S589, it is determined based on the rotational position θ acquired from the rotation angle sensor whether or not the motor 10 is rotating. When it is determined that the motor 10 is rotating (S589: YES), this determination processing is repeated. When it is determined that the motor 10 is not rotating (S589: NO), the flow proceeds to S590.

At S590, it is determined whether or not the V1 terminal voltage agrees with 50% of the PIG1 voltage. When the V1 terminal voltage is within a predetermined range with an output value of 50% of the PIG1 voltage at the center, it is determined that "the V1 terminal voltage agrees with 50% of the PIG1 voltage." The predetermined range can be arbitrarily set between 0 and power supply voltage with measurement error and the like taken into account. When the V1 terminal voltage agrees with 50% of the PIG1 voltage (S590: YES), the flow proceeds to S594. When the V1 terminal voltage does not agree with 50% of the PIG1 voltage (S590: NO), the flow proceeds to S591.

At S591, the anomaly counter is incremented. At S592, it is determined whether or not the count on the anomaly counter is equal to or higher than the predetermined number of times N. When it is determined that the count on the anomaly counter is not equal to or higher than the predetermined number of times N (S592: NO), the flow returns to S589. When it is determined that the count on the anomaly counter is equal to or higher than the predetermined number of times N (S592: YES), the flow proceeds to S593. At S593, it is concluded that a short circuit failure in which the V1 lower MOS 25 cannot be brought out of conduction has occurred in the pre-driver 52 and the failure detection processing is terminated.

At S594 to which the flow proceeds when it is determined that the V1 terminal voltage agrees with 50% of the PIG1 voltage (S590: YES), it is concluded that the following short circuit failure has not occurred in the pre-driver 52: a short circuit failure in which the V1 lower MOS 25 cannot be brought out of conduction. Then the anomaly counter is reset and the flow proceeds to S601 in FIG. 15.

At S601 in FIG. 15, the W1 lower MOS 26 is on-controlled through the pre-driver 52. At this time, all the MOSs 21 to 25, other than the W1 lower MOS 26, in the first inverter unit 20 remain off. It has been concluded that there is no short circuit failure in the W1 upper MOS 23. Even though the W1 lower MOS 26 is on-controlled, therefore, an overcurrent does not flow from the W1 upper MOS 23 to the W1 lower MOS 26.

At S602, it is determined based on the rotational position θ acquired from the rotation angle sensor whether or not the motor 10 is rotating. When it is determined that the motor 10 is rotating (S602: YES), this determination processing is repeated. When it is determined that the motor 10 is not rotating (S602: NO), the flow proceeds to S603.

At S603, it is determined whether or not the W1 terminal voltage is zero. When it is determined that the W1 terminal voltage is zero (S603: YES), the flow proceeds to S607. When it is determined that the W1 terminal voltage is not zero (S603: NO), the flow proceeds to S604.

At S604, the anomaly counter is incremented. At S605, it is determined whether or not the count on the anomaly counter is equal to or higher than the predetermined number of times N. When it is determined that the count on the anomaly counter is not equal to or higher than the predetermined number of times N (S605: NO), the flow returns to S602. When it is determined that the count on the anomaly counter is equal to or higher than the predetermined number of times N (S605: YES), the flow proceeds to S606. At S606, it is concluded that an open failure in which the W1 lower MOS 26 cannot be brought into conduction has occurred and the failure detection processing is terminated.

At S607 to which the flow proceeds when it is determined that the W1 terminal voltage is zero (S603: YES), it is concluded that the following open failure has not occurred in the W1 lower MOS 26 or the pre-driver 52: an open failure in which the W1 lower MOS 26 cannot be brought into conduction. Then the anomaly counter is reset.

At S608, the W1 lower MOS 26 on-controlled at S601 is off-controlled. That is, all the MOSs 21 to 26 are turned off. At S609, it is determined based on the rotational position θ acquired from the rotation angle sensor whether or not the motor 10 is rotating. When it is determined that the motor 10 is rotating (S609: YES), this determination processing is repeated. When it is determined that the motor 10 is not rotating (S609: NO), the flow proceeds to S610.

At S610, it is determined whether or not the W1 terminal voltage agrees with 50% of the PIG1 voltage. When the W1 terminal voltage is within a predetermined range with an output value of 50% of the PIG1 voltage at the center, it is determined that "the W1 terminal voltage agrees with 50% of the PIG1 voltage." The predetermined range can be arbitrarily set between 0 and power supply voltage with measurement error and the like taken into account. When the W1 terminal voltage agrees with 50% of the PIG1 voltage (S610: YES), the flow proceeds to S614. When the W1 terminal voltage does not agree with 50% of the PIG1 voltage (S610: NO), the flow proceeds to S611.

At S611, the anomaly counter is incremented. At S612, it is determined whether or not the count on the anomaly counter is equal to or higher than the predetermined number of times N. When it is determined that the count on the anomaly counter is not equal to or higher than the predetermined number of times N (S612: NO), the flow returns to S609. When it is determined that the count on the anomaly counter is equal to or higher than the predetermined number of times N (S612: YES), the flow proceeds to S613. At S613, it is concluded that a short circuit failure in which the W1 lower MOS 26 cannot be brought out of conduction has occurred in the pre-driver 52 and the failure detection processing is terminated.

At S614 to which the flow proceeds when it is determined that the W1 terminal voltage agrees with 50% of the PIG1 voltage (S610: YES), it is concluded that the following short circuit failure has not occurred in the pre-driver 52: a short circuit failure in which the W1 lower MOS 26 cannot be brought out of conduction. Then the anomaly counter is resent and the failure determination processing is terminated. When a short circuit failure or an open failure is not detected in the MOSs 21 to 26 or the pre-driver 52 by the failure detection processing up to this point, the flow proceeds to S57 in FIG. 9 as mentioned above. Then drive control on the motor 10 by normal PWM control is started.

In the failure determination processing in this embodiment, failure detection is carried out in the order of the U1 upper MOS 21 to the V1 upper MOS 22 to the W1 upper MOS 23 to the U1 lower MOS 24 to the V1 lower MOS 25 to the W1 lower MOS 26. However, failure detection may be carried out from any MOS.

Hereafter, description will be given to effects of the motor driving device 1. The above-mentioned effects (2), (4), and (5) of the first embodiment also apply to this embodiment and thus the description thereof will be omitted. In this embodiment, a short circuit failure due to fixation at on or the like in the MOSs 21 to 26 themselves is detected based on terminal voltage and PIG1 voltage before normal PWM control is started. When a short circuit failure in the MOSs 21 to 26 themselves is not detected, a short circuit failure in the pre-driver 52 in which the on-controlled MOSs 21 to 26 cannot be brought out of conduction is detected based on the following: terminal voltage and PIG1 voltage obtained when all the MOSs 21 to 26 are off-controlled after one of the MOSs 21 to 26 is on-controlled (S510 in FIG. 10, S530 in FIG. 11, S550 in FIG. 12, S570 in FIG. 13, S590 in FIG. 14, S610 in FIG. 15). As a result, a path through which a current flows from the upper MOSs 21 to 23 to the lower MOSs 24 to 26 paired therewith is not formed. Therefore, a short circuit failure in the pre-driver 52 can be detected without passage of an overcurrent. Consequently, burnout of each inverter can be restricted. Similarly with the first embodiment, this embodiment is also provided with the voltage application units 65, 66 capable of applying voltage to the winding sets 18, 19 with the inverter units 20, bypassed. Therefore, even when the MOSs 21 to 26 are off, terminal voltage can be detected and thus the above-mentioned failure detection processing can be carried out. Since a point of failure in the pre-driver can be identified, failure analyses are facilitated and a number of man-hours for repair can be reduced.

Any open failure in which a switching element turned on cannot be brought into conduction is detected based on terminal voltage and PIG1 voltage detected when one of the MOSs 21 to 26 is on-controlled. When the terminal voltage detected when one of the upper MOSs 21 to 23 is turned on and the PIG1 voltage do not agree with each other (S503 in FIG. 10, S523 in FIG. 11, S543 in FIG. 12), the following open failure is detected: an open failure in which an on-controlled MOS 21 to 23 cannot be brought into conduction. When the terminal voltage detected when one of the lower MOSs 24 to 26 is on-controlled is zero (S563 in FIG. 13, S583 in FIG. 14, S603 in FIG. 15), the following open failure is detected: an open failure in which a MOS 24 to 26 turned on cannot be brought into conduction. This makes it possible to easily identify a point of open failure and thus failure analyses are facilitated and a number of man-hours for repair can be reduced.

The control unit 50 in this embodiment may function as "rotation control unit," "first failure detection unit," "second failure detection unit," "third failure detection unit," and "stop determining unit." S57 in FIG. 9 may correspond to processing as functions of the "rotation control unit" and S53 to S55 may correspond to processing as functions of the "first failure detection unit." S510 to S513 in FIG. 10, S530 to S533 in FIG. 11, S550 to S553 in FIG. 12, S570 to S573 in FIG. 13, S590 to S593 in FIG. 14, and S610 to S613 in FIG. 15 may correspond to processing as functions of the "second failure detection unit." S503 to S506 in FIG. 10, S523 to S526 in FIG. 11, S543 to S546 in FIG. 12, S563 and S564 in FIG. 13, S583 to S586 in FIG. 14, and S603 to S606 in FIG. 15 may correspond to processing as functions of the "third failure detection unit." S52 in FIG. 9, S502 and S509 in FIG. 10, S522 and S529 in FIG. 11, S542 and S549 in FIG. 11, S542 and S549 in FIG. 12, S562 and S569 in FIG. 13, S582 and S589 in FIG. 14, and S602 and S609 in FIG. 15 may correspond to processing as functions of the "stop determining unit."

Other Embodiments

In the above embodiments, terminal voltage and PIG voltage are compared with each other after it is determined that the motor is not rotating. However, the determination of whether or not the motor is rotating may be omitted. This makes it possible to simplify the failure detection processing. In the above embodiments, open failure detection is carried out. However, since an overcurrent does not flow even with an open failure, the motor driving device may be so configured that open failure detection is omitted and only short circuit failure detection is carried out. This makes it possible to simplify the failure detection processing. In the above embodiments, two inverter units are provided. Instead, only one inverter unit may be provided or three or more inverter units may be provided. In the above embodiments, each voltage application unit is configured of a pull-up resistor. Instead, they may be configured of, for example, a diode, a regulator, comparator, or the like as long as voltage can be supplied to the winding sets with the inverter units bypassed. In the above embodiments, the motor driving device is used in EPS (Electric Power Steering). However, the application of the motor driving device is not limited to EPS and it can be used in items, such as a main motor for hybrid vehicles and power windows, other than EPS.

Summarizing the above embodiments, a motor driving device includes a motor, an inverter unit, an energization state switching unit, a voltage application unit, a power voltage detection unit, a terminal voltage detection unit, and a control unit. The motor includes multiple winding sets each including windings corresponding to multiple phases. The inverter unit is provided for each of the winding sets. The inverter units include multiple switching elements in switching element pairs configured of high potential-side switching elements set on the high potential side and low potential-side switching elements set on the low potential side in correspondence with the phases of the windings. The inverter units supply a current to the windings. The energization state switching unit switches each switching element between on and off. The energization state switching unit is, for example, a pre-driver. The voltage application units apply voltage to the windings with the inverter units bypassed. The power voltage detection units detect power voltage between each of the inverter units and a power supply. The terminal voltage detection units detect the terminal voltage, or the voltage at the contact between each switching element and a winding on a winding-by-winding basis.

The control unit includes a rotation control unit, a first failure detection unit, and a second failure detection unit. The rotation control unit controls the rotation of the motor by controlling the energization state switching unit to switch each switching element between on and off. Failure detection by the first failure detection unit and the second failure detection unit is carried out before motor rotation control by the rotation control unit is started. The first failure detection unit detects a short circuit failure in the switching elements based on terminal voltage and power voltage. When a short circuit failure in the switching elements is not detected by the first failure detection unit, a short circuit failure in the energization state switching unit in which a switching element cannot be brought out of conduction is detected based on the following: the terminal voltage and the power voltage detected when all the switching elements are off-controlled after at least one of either of the high potential-side switching elements and the low potential-side switching elements is on-controlled. The "on-control" cited in this specification refers to that a switching element is driven and controlled to turn it on. Similarly, the "off-control" referees to that a switching element is driven and controlled to turn it off.

In the present configuration, the following short circuit failure is detected by the first failure detection unit before on-control and off-control of the switching elements by the energization state switching unit is carried out: such a short circuit failure that, for example, a switching element itself is fixed at on. In addition to this, a short circuit failure that is caused when a switching element is on-controlled through the energization state switching unit is detected by the second failure detection unit. In so-called PWM control, on-control and off-control of the high potential-side switching elements and the low potential-side switching elements are periodically switched. The second failure detection unit detects a short circuit failure in the energization state switching unit based on the following: terminal voltage and power voltage detected when all the switching elements are off-controlled, instead of on-controlling one of paired switching elements, when the other is on-controlled unlike in the above-mentioned so-called PWM control. As a result, a path through which a current flows from a high potential-side switching element to a low potential-side switching element is not formed. Therefore, it is possible to detect a short circuit failure in the energization state switching unit without passage of an overcurrent. Consequently, burnout of the inverters can be restricted. The present configuration is provided with the voltage application units that apply voltage to the windings with the inverter units bypassed; therefore, terminal voltage can be detected with the switching elements off.

When some sort of failure occurs in a switching element, a closed circuit is produced in the motor and an unexpected regenerative brake is generated in the motor and may destroy the motor driving system. To cope with this, a motor relay is provided as an energization interrupting unit that can interrupt a current flowing between the inverter units and each winding when a failure occurs in a switching element. Motor driving devices including multiple inverter units have been considered to continue motor operation even when a failure occurs in a switching element and enhance reliability. When such a motor driving device including inverter units in multiple systems is provided with the above-mentioned motor relay, the following problem may arises: a number of motor relays corresponding to the number of systems are required and this increases the size of the motor driving device.

The motor driving device according to may be provided with multiple inverter units. The first failure detection unit and the second failure detection unit detect any failure in the switching elements or the energization state switching unit with the winding sets and the inverter units electrically connected with each other. In the present configuration, when one of paired switching elements is on-controlled, the other is not on-controlled but all the switching elements are off-controlled to detect a short circuit failure; therefore, an overcurrent does not flow. Consequently, a short circuit failure can be detected with the winding sets and the inverter units electrically connected with each other. This obviates necessity for a motor relay and contributes to downsizing of the motor driving device. In the present configuration, inverter units are configured in multiple systems and there is no motor relay. Even when a switching element fails and a regenerative brake is generated in the motor, it is possible to cover driving force equivalent to the regenerative brake at a sound inverter unit. When inverter units are configured in multiple systems, failure detection processing is independently carried out on an inverter unit-by-inverter unit basis. Further, failure detection processing can be simultaneously carried out in multiple systems.

The second failure detection unit may detect a short circuit failure in the energization state switching unit in which a high potential-side switching element cannot be brought out of conduction. This detection is carried out based on terminal voltage and power voltage detected when all the switching elements are off-controlled after all the high potential-side switching elements are on-controlled. The second failure detection unit may detect a short circuit failure in the energization state switching unit in which a low potential-side switching element cannot be brought out of conduction. This detection is carried out based on terminal voltage and power voltage detected when all the switching elements are off-controlled after all the low potential-side switching elements are on-controlled. As mentioned above, a short circuit failure is detected based on terminal voltage and power voltage detected when all the switching elements are off-controlled after all the high potential-side switching elements or the low potential-side switching elements are on-controlled. This makes it possible to shorten a failure detection time as compared with cases where each switching element is on-controlled and all the switching elements are off-controlled.

The control unit may further include a third failure detection unit. The third failure detection unit detects an open failure in which a switching element cannot be brought into conduction in cases where: a short circuit failure in the switching elements is not detected by the first failure detection unit and a short circuit failure in the energization state switching unit in which a switching element cannot be turned off is not detected by the second failure detection unit. The third failure detection unit carries out open failure detection with respect to each of the switching element pairs. It detects an open failure in which at least either of a high potential-side switching element and a low potential-side switching element cannot be brought into conduction based on at least either of power voltage and terminal voltage detected on the following occasion: an occasion that a state in which the high potential-side switching elements are on-controlled and the low potential-side switching elements are off-controlled and a state in which the high potential-side switching elements are off-controlled and the low potential-side switching elements are on-controlled are periodically switched.

The third failure detection unit carries out open failure detection after the absence of a short circuit failure is determined by the first failure detection unit and the second failure detection unit. Therefore, an overcurrent does not flow from a high potential-side switching element to a low potential-side switching element even when the following states are periodically switched: a state in which the high potential-side switching elements are on-controlled and the low potential-side switching elements are off-controlled and a state in which the high potential-side switching elements are off-controlled and the low potential-side switching elements are on-controlled. Therefore, burnout of the inverters can be restricted.

The third failure detection unit may detect an open failure in which at least either of a high potential-side switching element and a low potential-side switching element cannot be brought into conduction as follows. Terminal voltage is detected when the following states are periodically switched with respect to each switching element pair: a state in which the high potential-side switching element is on-controlled and the low potential-side switching element is off-controlled and a state in which the high potential-side switching element is off-controlled and the low potential-side switching element is on-controlled. The percentage of the time for which the high potential-side switching elements are on-controlled to one cycle by which the switching elements are switched between on-control and off-control is multiplied by power voltage. The third failure detection unit may detect an open failure when the terminal voltage does not agree with the result of the multiplication. This makes it possible to more appropriately detect any open failure.

The third failure detection unit may detects an open failure in which a low potential-side switching element cannot be brought into conduction as follows. Terminal voltage is detected when the high potential-side switching element and the low potential-side switching element are periodically switched between on-control and off-control with respect to each switching element pair. The sum of voltage applied by the voltage application units when all the switching elements are off and voltage supplied from the power supply is multiplied by the percentage of the time for which the high potential-side switching elements are on-controlled to one cycle by which the switching elements are switched between on-control and off-control. The third failure detection unit may detect an open failure when the terminal voltage becomes equal to the result of the multiplication. The third failure detection unit may detect an open failure in which a high potential-side switching element cannot be brought into conduction as follows. Terminal voltage is detected when the high potential-side switching element and the low potential-side switching element are periodically switched between on-control and off-control with respect to each switching element pair. The voltage applied by the voltage application units when all the switching elements are off is multiplied by the percentage of the time for which the high potential-side switching elements are on-controlled to one cycle by which the switching elements are switched between on-control and off-control. The third failure detection unit may detect an open failure when the terminal voltage becomes equal to the result of the multiplication. This makes it possible to identify a point of open failure and thus failure analyses are facilitated and a number of man-hours for repair can be reduced.

The second failure detection unit may detect a short circuit failure in the energization state switching unit in which a switching element turned on cannot be brought out of conduction based on terminal voltage and power voltage on the following occasion: an occasion in which one of the switching elements is on-controlled and then all the switching elements are off-controlled. This makes it possible to identify a point where the short circuit failure has occurred in the energization state switching unit; therefore, failure analyses are facilitated and a number of man-hours for repair can be reduced.

The control unit may include a third failure detection unit for detecting open failures. The third failure detection unit detects an open failure in which an on-controlled switching element cannot be brought into conduction based on power voltage and terminal voltage detected when one of the switching elements is on-controlled. Specifically, an open failure can be detected as described below: The third failure detection unit may detect an open failure in which an on-controlled high potential-side switching element cannot be brought into conduction in the following cases: cases where terminal voltage and power voltage detected when one of the high potential-side switching elements is on-controlled do not agree with each other. Further, the third failure detection unit may detect an open failure in which an on-controlled low potential-side switching element cannot be brought into conduction in the following cases: cases where terminal voltage detected when one of the low potential-side switching elements is on-controlled is zero. This makes it possible to easily identify a point of open failure and thus failure analyses are facilitated and a number of man-hours for repair can be reduced.

For example, in cases where a motor is used in an electric power steering system, the following can take place when steering operation is performed by a user: as the result of rotation of the motor, back electromotive voltage can be produced and voltage can fluctuate. To cope with this, the control unit may include a stop determining unit that determines whether or not the operation of the motor is at a stop. When it is determined that the rotation of the motor is at a stop, the first failure detection unit, second failure detection unit, or third failure detection unit detects a failure in a switching element or the energization state switching unit. This enables accurate failure determination.

An electric power steering device using the above-mentioned motor driving device may be provided. In the electric power steering device, any failure in the switching elements and the energization state switching unit can be detected without passage of an overcurrent before the rotation of the motor is started. This contributes to enhancement of safety.

The above structures of the embodiments may be combined as appropriate.

The above processings such as calculations and determinations are not limited being executed by the control unit 50. The control unit may have various structures including the control unit 50 shown as an example.

The above processings such as calculations and determinations may be performed by any one or any combinations of software, an electric circuit, a mechanical device, and the like. The software may be stored in a storage medium, and may be transmitted via a transmission device such as a network device. The electric circuit may be an integrated circuit, and may be a discrete circuit such as a hardware logic configured with electric or electronic elements or the like. The elements producing the above processings may be discrete elements and may be partially or entirely integrated.

It should be appreciated that while the processes of the embodiments of the present invention have been described herein as including a specific sequence of steps, further alternative embodiments including various other sequences of these steps and/or additional steps not disclosed herein are intended to be within the steps of the present invention.

Various modifications and alternations may be diversely made to the above embodiments without departing from the spirit of the present invention.

What is claimed is:

1. A motor driving device comprising:
   a motor including a plurality of winding sets having windings corresponding to a plurality of phases;
   an inverter unit provided for each of the winding sets and configured to supply a current to the windings, the inverter unit including a plurality of switching elements including switching element pairs respectively corresponding to the phases of the windings, each of the switching element pairs including a high potential-side switching element on a high potential side and a low potential-side switching element on a low potential side;
   a switching unit configured to switch each of the switching elements between on and off;
   a voltage application unit configured to apply a voltage to the windings without passing through the inverter unit;
   a power voltage detection unit configured to detect a power voltage between the inverter unit and a power supply;
   a terminal voltage detection unit configured to detect a terminal voltage at a contact between each of the switching elements and corresponding one of the windings; and
   a control unit including a rotation control unit, a first failure detection unit, and a second failure detection unit, wherein
   the rotation control unit is configured to control the switching unit to switch each of the switching elements between on and off to control rotation of the motor,
   the first failure detection unit is configured to detect a short circuit failure in the switching elements based on the terminal voltage and the power voltage before the rotation control unit starts control of the rotation of the motor, and
   the second failure detection unit is configured such that,
      before the rotation control unit starts control of the rotation of the motor and when the first failure detection unit does not detect a failure in the switching elements and
      in a condition where the switching unit is caused to switch at least one of the high potential-side switching element and the low potential-side switching element on and subsequently switch all the switching elements off,
      the second failure detection unit determines whether the switching unit is incapable of rendering the switching element non-conductive to detect a short circuit failure in the switching unit based on the terminal voltage and the power voltage.

2. The motor driving device according to claim 1, wherein the inverter unit includes a plurality of inverter units, and the first failure detection unit and the second failure detection unit are configured to detect a failure in the switching elements or the switching unit in a condition where the winding sets are electrically connected with the inverter units.

3. The motor driving device according to claim 1, wherein the second failure detection unit is configured such that,
   in a condition where the switching unit is caused to switch all the high potential-side switching element on and subsequently switch all the switching elements off,
   the second failure detection unit determines whether the switching unit is incapable of rendering the high potential-side switching element non-conductive to detect a short circuit failure in the switching unit based on the terminal voltage and the power voltage.

4. The motor driving device according to claim 1, wherein the second failure detection unit is configured such that,
   in a condition where the switching unit is caused to switch all the low potential-side switching element on and subsequently switch all the switching elements off,
   the second failure detection unit determines whether the switching unit is incapable of rendering the low potential-side switching element non-conductive to detect a short circuit failure in the switching unit based on the terminal voltage and the power voltage.

5. The motor driving device according to claim 1, wherein the control unit further includes a third failure detection unit,
the third failure detection unit is configured such that,
when the first failure detection unit does not detect a short circuit failure in the switching elements and when the second failure detection unit determines that the switching unit is capable of rendering the switching elements non-conductive and does not detect a short circuit failure in the switching unit and
in a condition where the switching unit is caused to alter periodically a state, in which the high potential-side switching element is switched on and the low potential-side switching element is switched off in each of the switching element pairs, and a state, in which the high potential-side switching element is switches off and the low potential-side switching element is switches on in each of the switching element pairs,
the third failure detection unit determines whether the switching unit is incapable of rendering at least one the high potential-side switching element and the low potential-side switching element conductive to detect an open failure based on at least one of the power voltage and the terminal voltage.

6. The motor driving device according to claim 5, wherein the third failure detection unit is configured such that,
in a condition where the switching unit is caused to alter periodically a state, in which the high potential-side switching element is switched on and the low potential-side switching element is switched off in each of the switching element pairs, and a state, in which the high potential-side switching element is switched off and the low potential-side switching element is switched on in each of the switching element pairs and
when the terminal voltage does not agree with a value obtained by multiplying the power voltage by a percentage of a time, for which the high potential-side switching element is switched on, to one cycle of switching between on and off,
the third failure detection unit determines that the switching unit is incapable of rendering at least one the high potential-side switching element and the low potential-side switching element conductive and detects an open failure.

7. The motor driving device according to claim 5, wherein the third failure detection unit is configured such that,
in a condition where the switching unit is caused to alter periodically a state, in which the high potential-side switching element and the low potential-side switching element are switched on and off in each of the switching element pairs and
when the terminal voltage agrees with a value obtained by multiplying a sum of the voltage applied by the voltage application unit and the voltage applied by the power supply when all the switching elements are switched off by a percentage of a time, for which the high potential-side switching element is switched on to one cycle of switching between on and off,
the third failure detection unit determines that the switching unit is incapable of rendering the low potential-side switching element conductive and detects an open failure.

8. The motor driving device according to claim 5, wherein the third failure detection unit is configured such that,
in a condition where the switching unit is caused to alter periodically a state, in which the high potential-side switching element and the low potential-side switching element are switched on and off in each of the switching element pairs and
when the terminal voltage agrees with a value obtained by multiplying the voltage applied by the voltage application unit when all the switching elements are switched off by a percentage of a time, for which the high potential-side switching element is switched on to one cycle of switching between on and off,
the third failure detection unit determines that the switching unit is incapable of rendering the high potential-side switching element conductive and detects an open failure.

9. The motor driving device according to claim 1, wherein the second failure detection unit is configured such that
in a condition where the switching unit is caused to switch one of the switching elements on and subsequently switch all the switching elements off,
the second failure detection unit determines whether the switching unit is incapable of rendering the one switching element non-conductive to detect a short circuit failure in the switching unit based on the terminal voltage and the power voltage.

10. The motor driving device according to claim 9, wherein the control unit further includes a third failure detection unit configured such that
in a condition where the switching unit is caused to switch one of the switching elements on,
the third failure detection unit determines whether the switching unit is incapable of rendering the one switching element conductive to detect an open failure in the switching unit based on the terminal voltage and the power voltage.

11. The motor driving device according to claim 10, wherein
the third failure detection unit is configured such that
in a condition where the switching unit is caused to switch one of the high potential-side switching elements on and
when the terminal voltage does not agree with the power voltage,
the third failure detection unit determines that the switching unit is incapable of rendering the one high potential-side switching element conductive and detects an open failure in the switching unit.

12. The motor driving device according to claim 10, wherein
the third failure detection unit is configured such that
in a condition where the switching unit is caused to switch one of the low potential-side switching elements on and
when the terminal voltage is zero,
the third failure detection unit determines that the switching unit is incapable of rendering the one low potential-side switching element conductive and detects an open failure in the switching unit.

13. The motor driving device according to claim 1, wherein the control unit further includes a stop determining unit configured to determine whether rotation of the motor is at a stop,
the control unit is configured to detect a failure in the switching elements or the switching unit when the stop determining unit determines that rotation of the motor is at a stop.

14. An electric power steering device using the motor driving device according to claim 1.

15. A method for detecting failure in a motor driving device, the motor driving device including:
- a motor including a plurality of winding sets having windings corresponding to a plurality of phases;
- an inverter unit provided for each of the winding sets and configured to supply a current to the windings, the inverter unit including a plurality of switching elements including switching element pairs respectively corresponding to the phases of the windings, each of the switching element pairs including a high potential-side switching element on a high potential side and a low potential-side switching element on a low potential side; and
- a switching unit configured to switch each of the switching elements between on and off, the method comprising:
- detecting a power voltage between the inverter unit and a power supply;
- detecting a terminal voltage at a contact between each of the switching elements and corresponding one of the windings; applying a voltage to the windings without passing through the inverter unit to detect a short circuit failure in the switching elements based on the terminal voltage and the power voltage before rotation of the motor; and
- causing, before rotation of the motor and when the short circuit failure in the switching elements is not detected, the switching unit to switch on at least one of the high potential-side switching element and the low potential-side switching element and subsequently switch all the switching elements off and determining whether the switching unit is incapable of rendering the switching element non-conductive to detect a short circuit failure in the switching unit based on the terminal voltage and the power voltage.

16. A non-transitory computer-readable recording medium having a computer program comprising instructions executed by a computer, the instructions including the method according to claim 15.

* * * * *